United States Patent
Choi et al.

(10) Patent No.: US 12,439,815 B2
(45) Date of Patent: Oct. 7, 2025

(54) BLUE LIGHT ABSORBING FILM, AND PHOTOELECTRIC DEVICE, IMAGE SENSOR AND ELECTRONIC DEVICE INCLUDING THE SAME

(71) Applicants: Samsung Electronics Co., Ltd., Suwon-si (KR); Seoul National University, R&DB Foundation, Seoul (KR)

(72) Inventors: Yeong Suk Choi, Suwon-si (KR); Soo Young Park, Seoul (KR); Sung Young Yun, Suwon-si (KR); Hyeong-Ju Kim, Changwon-si (KR); Min-Woo Choi, Seoul (KR); Su-Yeon Kim, Seoul (KR); Jin Hong Kim, Seoul (KR); Seyoung Jung, Busan (KR)

(73) Assignees: Samsung Electronics Co., Ltd., Gyeonggi-do (KR); Seoul National University R & DB Foundation, Seoul (KR)

( * ) Notice: Subject to any disclaimer, the term of this patent is extended or adjusted under 35 U.S.C. 154(b) by 805 days.

(21) Appl. No.: 17/565,726

(22) Filed: Dec. 30, 2021

(65) Prior Publication Data
US 2022/0209134 A1 Jun. 30, 2022

(30) Foreign Application Priority Data
Dec. 30, 2020 (KR) .................. 10-2020-0188467

(51) Int. Cl.
*H10K 85/60* (2023.01)
*C07D 471/04* (2006.01)
(Continued)

(52) U.S. Cl.
CPC ......... *H10K 85/621* (2023.02); *C07D 471/04* (2013.01); *H10K 85/626* (2023.02);
(Continued)

(58) Field of Classification Search
None
See application file for complete search history.

(56) References Cited

U.S. PATENT DOCUMENTS 8,525,577 B2 9/2013 Yofu et al.
2019/0040188 A1 2/2019 Nanson et al.
(Continued)

FOREIGN PATENT DOCUMENTS

KR 2019-0122035 A 10/2019
WO WO-2015115229 A1 8/2015
(Continued)

OTHER PUBLICATIONS

M Ihama et al. "CMOS Image Sensor with a Thin Overlaid Panchromatic Organic Photoconductive Layer for Sensors with Reduced Pixel Size" IDW, 2009, INP 1-4.
(Continued)

*Primary Examiner* — Anthony Ho
(74) *Attorney, Agent, or Firm* — Harness, Dickey & Pierce, P.L.C.

(57) ABSTRACT

Disclosed are a film and a photoelectric device including the compound of Chemical Formula 1 and configured to selectively absorb light in a blue wavelength region, and an image sensor and electronic device including the same:

[Chemical Formula 1]

(Continued)

In Chemical Formula 1, each substituent is the same as defined in the detailed description.

24 Claims, 13 Drawing Sheets

(51) Int. Cl.
 *H10K 30/30* (2023.01)
 *H10K 39/32* (2023.01)
(52) U.S. Cl.
 CPC ......... H10K 85/6572 (2023.02); *H10K 30/30* (2023.02); *H10K 39/32* (2023.02)

(56) References Cited

U.S. PATENT DOCUMENTS

| | | | |
|---|---|---|---|
| 2020/0152888 A1 | 5/2020 | Choi et al. | |
| 2021/0179933 A1 | 6/2021 | Park et al. | |

FOREIGN PATENT DOCUMENTS

| | | | |
|---|---|---|---|
| WO | WO-2017133752 A1 | 8/2017 | |
| WO | WO-2019/203481 A1 | 10/2019 | |

OTHER PUBLICATIONS

S. Aihara et al. "Stacked Image SensorWith Green- and Red-Sensitive Organic Photoconductive Films Applying Zinc Oxide Thin-Film Transistors to a Signal Readout Circuit" IEEE Transactions On Electron Devices, vol. 56, No. 11, Nov. 2009.
H Seo et al. "Color Sensors with Three Vertically Stacked Organic Photodetectors" Japanese Journal of Applied Physics, vol. 46, No. 49, 2007, pp. L1240-L1242.
S Lim et al. "Organic-on-silicon complementary metal-oxide-semiconductor colour image sensors" Scientific Reports 5, Article No. 7708 (2015).
W. Yoon et al. "A Novel Bis-Lactam Acceptor with Outstanding Molar Extinction Coefficient and Structural Planarity for Donor—Acceptor Type Conjugated Polymer" American Chemical Society, Macromol, 2016, 49, pp. 8489-8497.
W. Yoon et al."A Novel Bis-Lactam Acceptor with Outstanding Molar Extinction Coefficient and Structural Planarity for Donor—Acceptor Type Conjugated Polymer" American Chemical Society, Macromol, 2016, pages S1-S26; Supporting Information.
European Communication pursuant to Article 94(3) EPC dated Apr. 22, 2024 for corresponding European Application No. 21218364.4.
Extended European Search Report dated May 23, 2022 for corresponding European Application No. 21218364.4.
Kim Jin Hong et al., "Novel Organic Semiconductors Based on 1,5-Naphtyridine-2,6-Dione Unit for Blue-Selective Organic Phototransistor", Advanced Optical Materials, vol. 8, No. 20, XP055919732, p. 2000695, Jul. 26, 2020.

BLUE LIGHT ABSORBING FILM, AND PHOTOELECTRIC DEVICE, IMAGE SENSOR AND ELECTRONIC DEVICE INCLUDING THE SAME

CROSS-REFERENCE TO RELATED APPLICATION

This application claims priority to and the benefit of Korean Patent Application No. 10-2020-0188467 filed in the Korean Intellectual Property Office on Dec. 30, 2020, the entire contents of which are incorporated herein by reference.

BACKGROUND

1. Field

A blue light absorbing film, and a photoelectric device, an image sensor, and an electronic device including the same are disclosed.

2. Description of the Related Art

A photoelectric device converts light into an electrical signal using photoelectric effects. The photoelectric device may include a photodiode, a phototransistor, and the like, and it may be applied to an image sensor, an organic light emitting diode, and the like.

An image sensor including a photodiode requires high resolution and thus a small pixel. At present, a silicon photodiode is widely used, but it has a problem of deteriorated sensitivity since silicon photodiode has a smaller absorption area due to small pixels. Accordingly, an organic material that is capable of replacing silicon has been researched.

SUMMARY

Some example embodiments provide a film and a photoelectric device (e.g., an organic photoelectric device) including a blue absorbing material capable of selectively absorbing light in a blue wavelength region. Such a blue absorbing material (e.g., compound) may be included in an organic material that may have a high extinction coefficient and may selectively absorb light in a particular wavelength region depending on a molecular structure, and thus may simultaneously replace a photodiode and a color filter and resultantly improve sensitivity and contribute to high integration.

Some example embodiments also provide an image sensor and an electronic device including the film and the photoelectric device.

According to some example embodiments, a film including a compound represented by Chemical Formula 1 and selectively absorbing light in a blue wavelength region is provided.

[Chemical Formula 1]

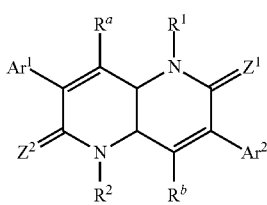

In Chemical Formula 1,
Ar$^1$ and Ar$^2$ are each independently a substituted or unsubstituted C5 to C30 aromatic hydrocarbon group or a substituted or unsubstituted C3 to C30 hetero aromatic hydrocarbon group,
Z$^1$ and Z$^2$ are each independently O, S, Se, Te, or C(CN)$_2$,
R$^1$ and R$^2$ are each independently a substituted or unsubstituted C6 to C40 alkyl group, a substituted or unsubstituted C3 to C30 cycloalkyl group, a substituted or unsubstituted C3 to C30 heterocycloalkyl group, a substituted or unsubstituted C6 to C30 aryl group, or a substituted or unsubstituted C3 to C30 heteroaryl group, and
R$^a$ and R$^b$ may each independently be hydrogen, deuterium, a halogen (F, Cl, Br, or I), a cyano group (—ON), or a C1 to C10 alkyl group.

In Chemical Formula 1, the substituted or unsubstituted C5 to C30 aromatic hydrocarbon group may be a substituted or unsubstituted phenyl group, a substituted or unsubstituted naphthyl group, a substituted or unsubstituted anthracenyl group, a substituted or unsubstituted phenanthrenyl group, a substituted or unsubstituted naphthacenyl group, a substituted or unsubstituted pyrenyl group, a substituted or unsubstituted biphenyl group, a substituted or unsubstituted p-terphenyl group, a substituted or unsubstituted m-terphenyl group, a substituted or unsubstituted o-terphenyl group, a substituted or unsubstituted chrysenyl group, a substituted or unsubstituted triphenylenyl group, a substituted or unsubstituted perylenyl group, a substituted or unsubstituted fluorenyl group, or a substituted or unsubstituted indenyl group.

In Chemical Formula 1, the substituted or unsubstituted C3 to C30 heteroaromatic hydrocarbon group may be a substituted or unsubstituted furanyl group, a substituted or unsubstituted thienyl group, a substituted or unsubstituted selenophenyl group, a substituted or unsubstituted pyrrolyl group, a substituted or unsubstituted pyrazolyl group, a substituted or unsubstituted imidazolyl group, a substituted or unsubstituted triazolyl group, a substituted or unsubstituted oxazolyl group, a substituted or unsubstituted isoxazolyl group, a substituted or unsubstituted thiazolyl group, a substituted or unsubstituted isothiazolyl group, a substituted or unsubstituted oxadiazolyl group, a substituted or unsubstituted thiadiazolyl group, a substituted or unsubstituted pyridyl group, a substituted or unsubstituted pyridinyl group, a substituted or unsubstituted pyridyl group, a substituted or unsubstituted pyrimidinyl group, a substituted or unsubstituted pyrazinyl group, a substituted or unsubstituted triazinyl group, a substituted or unsubstituted benzofuranyl group, a substituted or unsubstituted benzothiophenyl group, a substituted or unsubstituted benzimidazolyl group, a substituted or unsubstituted indolyl group, a substituted or unsubstituted quinolinyl group, a substituted or unsubstituted isoquinolinyl group, a substituted or unsubstituted quinazolinyl group, a substituted or unsubstituted phthalazinyl group, a substituted or unsubstituted quinoxalinyl group, a substituted or unsubstituted naphthyridinyl group, a substituted or unsubstituted cinnolinyl group, a substituted or unsubstituted benzoxazinyl group, a substituted or unsubstituted benzthiazinyl group, a substituted or unsubstituted acridinyl group, a substituted or unsubstituted phenazinyl group, a substituted or unsubstituted phenothiazinyl group, a substituted or unsubstituted phenoxazinyl group, a substituted or unsubstituted dibenzofuranyl group, a substituted or unsubstituted dibenzothiophenyl group, a substituted or unsubstituted benzotriazinyl group, a substituted or unsubstituted pyridopyrazinyl group, a substituted or unsubstituted pyridopyrimidinyl, a substituted or unsubstituted pyridopyridazinyl group, a substituted or unsubstituted benzothienyl group, or a substituted or unsubstituted benzoselenophenyl group.

The substituted or unsubstituted C5 to C30 aromatic hydrocarbon group in Chemical Formula 1 may be one of functional groups of Chemical Formula 1-1.

[Chemical Formula 1-1]

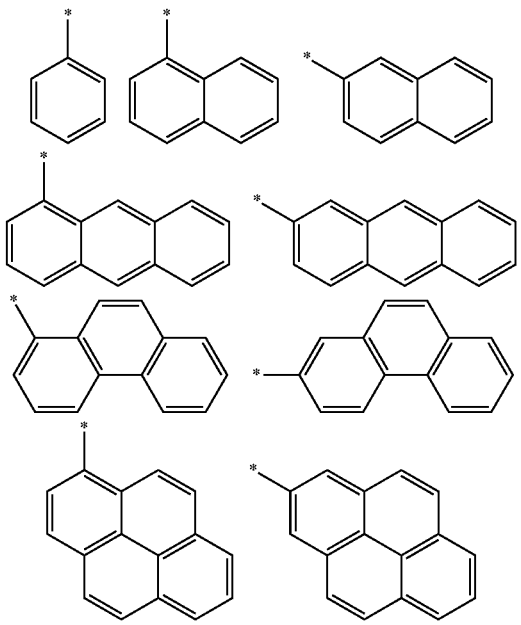

In Chemical Formula 1-1,
- a hydrogen of —CH— of each aromatic ring may be replaced by a substituent of a substituted or unsubstituted C1 to C20 alkyl group, a substituted or unsubstituted C1 to C20 alkoxy group, a substituted or unsubstituted C6 to C10 aryl group, a substituted or unsubstituted C4 to C10 heteroaryl group, a halogen (F, Cl, Br, or I), a cyano group (—CN), a cyano-containing group, or a combination thereof, and
- * indicates a linking position.

In Chemical Formula 1, the substituted or unsubstituted C3 to C30 hetero aromatic hydrocarbon group may be one of functional groups represented by Chemical Formula 1-2.

[Chemical Formula 1-2]

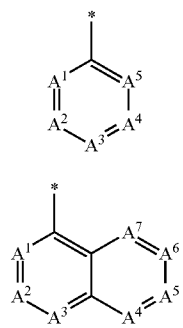 (1)

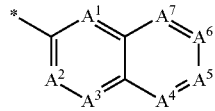 (2)

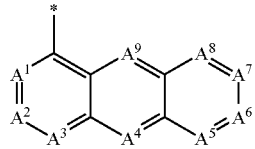 (3)

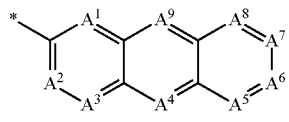 (4)

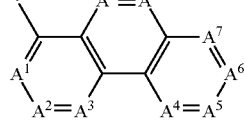 (5)

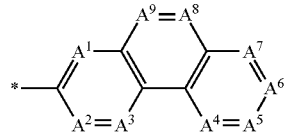 (6)

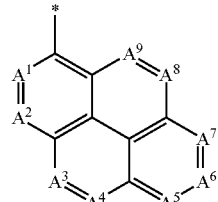 (7)

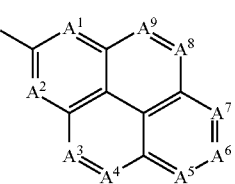 (8)

(9)

In Chemical Formula 1-2,
- $A^1$ to $A^9$ may each independently be N or $CR^k$, wherein $R^k$ may be hydrogen, deuterium, a substituted or unsubstituted C1 to C20 alkyl group, a substituted or unsubstituted C1 to C20 alkoxy group, a substituted or unsubstituted C6 to C10 aryl group, a substituted or unsubstituted C4 to C10 heteroaryl group, a halogen (F, Cl, Br, or I), a cyano group (—CN), a cyano-containing group, or a combination thereof,
- 1 to 3 of $A^1$ to $A^5$ of Chemical Formula (1) of Chemical Formula 1-2 may be N,
- 1 to 3 of $A^1$ to $A^7$ of Chemical Formulas (2) and (3) of Chemical Formula 1-2 may be N,
- 1 to 4 of $A^1$ to $A^9$ of Chemical Formulas (4) to (9) of Chemical Formula 1-2 may be N, and
- * indicates a linking position.

In Chemical Formula 1, the substituted or unsubstituted C5 to C30 aromatic hydrocarbon group may be one of functional groups represented by Chemical Formula 1-3.

[Chemical Formula 1-3]

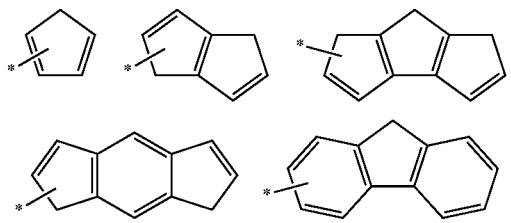

In Chemical Formula 1-3,
a hydrogen of —CH— of each aromatic ring may be replaced by a substituent of a substituted or unsubstituted C1 to C20 alkyl group, a substituted or unsubstituted C1 to C20 alkoxy group, a substituted or unsubstituted C6 to C10 aryl group, a substituted or unsubstituted C4 to C10 heteroaryl group, a halogen (F, Cl, Br, or I), a cyano group (—CN), a cyano-containing group, or a combination thereof, and
* indicates a linking position.

In Chemical Formula 1, the substituted or unsubstituted C3 to C30 hetero aromatic hydrocarbon group may be one of functional groups represented by Chemical Formula 1-4.

[Chemical Formula 1-4]

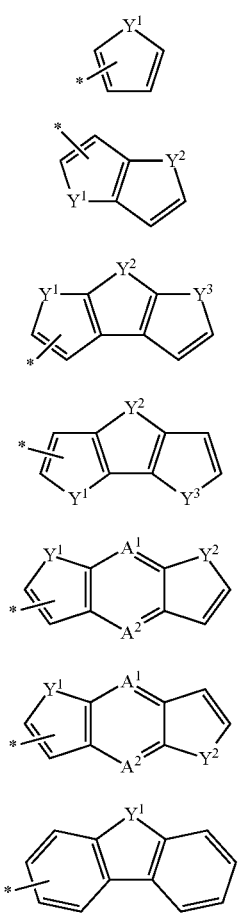

(1)
(2)
(3)
(4)
(5)
(6)
(7)

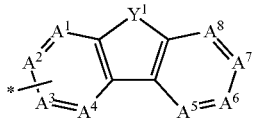

(8)

In Chemical Formula 1-4,
$Y^1$ to $Y^3$ may each independently be O, S, Se, Te, or $NR^a$, wherein, $R^a$ is hydrogen, deuterium, or a substituted or unsubstituted C1 to C10 alkyl group,
$A^1$ to $A^8$ may each independently be N or $CR^k$, wherein $R^k$ is hydrogen, deuterium, a substituted or unsubstituted C1 to C20 alkyl group, a substituted or unsubstituted C1 to C20 alkoxy group, a substituted or unsubstituted C6 to C10 aryl group, a substituted or unsubstituted C4 to C10 heteroaryl group, a halogen (F, Cl, Br, or I), a cyano group (—CN), a cyano-containing group, or a combination thereof,
a hydrogen of —CH— of each aromatic ring may be replaced by a substituent of a substituted or unsubstituted C1 to C20 alkyl group, a substituted or unsubstituted C1 to C20 alkoxy group, a substituted or unsubstituted C6 to C10 aryl group, a substituted or unsubstituted C4 to C10 heteroaryl group, a halogen (F, Cl, Br, or I), a cyano group (—CN), a cyano-containing group, or a combination thereof,
in Chemical Formula (8) of Chemical Formula 1-4, one of $A^1$ to $A^4$ may be a linking portion, and at least one of $A^1$ to $A^8$ may be nitrogen (N), and
* indicates a linking position.

The film may exhibit an absorption curve having a full width at half maximum (FWHM) of about 50 nm to about 90 nm.

The film may exhibit an absorption curve having a central wavelength of less than or equal to about 460 nm.

According to some example embodiments, a photoelectric device includes a first electrode and a second electrode facing each other, and an active layer between the first electrode and the second electrode and including the compound represented by Chemical Formula 1.

According to some example embodiments, an image sensor including the photoelectric device is provided.

The image sensor may include a semiconductor substrate integrated with a plurality of first photo-sensing devices configured to sense light in a green wavelength region and a plurality of second photo-sensing devices configured to sense light in a red wavelength region, and the photoelectric device is disposed on the semiconductor substrate and configured to selectively sense light in a blue wavelength region.

The plurality of first photo-sensing devices and the plurality of second photo-sensing devices may be stacked in a vertical direction in the semiconductor substrate.

The image sensor may further include a color filter layer including a green filter configured to selectively transmit light in a green wavelength region and a red filter configured to selectively transmit light in a red wavelength region.

The photoelectric device may be a blue photoelectric device configured to selectively sense light in a blue wavelength region, and the image sensor may include a red photoelectric device sensing light in a red wavelength region, a green photoelectric device sensing light in a green wavelength region, and the blue photoelectric device which are stacked.

According to some example embodiments, an electronic device including the image sensor is provided.

The film and device may have improved color purity by including a blue absorbing material that is selectively capable of absorbing light in a blue wavelength region. The blue absorbing material may increase wavelength selectivity by improving light absorption characteristics in a thin film state and reduce crosstalk between pixels.

DETAILED DESCRIPTION

Figure 1:
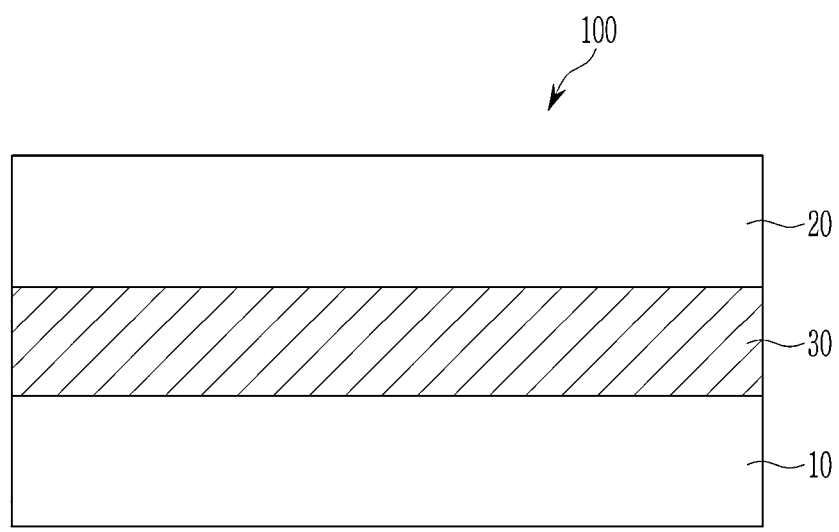
FIG. 1 is a cross-sectional view showing a photoelectric device according to some example embodiments.

Hereinafter, some example embodiments are described in detail so that those of ordinary skill in the art can easily implement them. However, a structure that is actually applied may be implemented in various different forms, and is not limited to the example embodiments described herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

In the drawings, parts having no relationship with the description are omitted for clarity of some example embodiments, and the same or similar constituent elements are indicated by the same reference numeral throughout the specification.

As used herein, "at least one of A, B, or C," "one of A, B, C, or a combination thereof" and "one of A, B, C, and a combination thereof" refer to each constituent element, and a combination thereof (e.g., A; B; C; A and B; A and C; B and C; or A, B and C).

As used herein, when specific definition is not otherwise provided, "substituted" refers to replacement of a hydrogen of a compound or a functional group by a substituent of a halogen atom (F, Br, Cl, or I), a hydroxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, a C1 to C20 alkyl group, a C1 to C20 alkoxy group, a C2 to C20 alkenyl group, a C2 to C20 alkynyl group, a C6 to C30 aryl group, a C7 to C30 arylalkyl group, a C2 to C20 heteroaryl group, C3 to C20 heteroarylalkyl group, a C3 to C30 cycloalkyl group, a C3 to C15 cycloalkenyl group, a C6 to C15 cycloalkynyl group, a C2 to C20 heterocycloalkyl group, or a combination thereof.

As used herein, when specific definition is not otherwise provided, "hetero" refers to one including 1 to 3 heteroatoms of N, O, S, Se, Te, P, or S.

As used herein, "alkyl group" refers to a monovalent linear or branched saturated hydrocarbon group, for example a methyl group, an ethyl group, a propyl group, an isopropyl group, an n-butyl group, an isobutyl group, a t-butyl group, a pentyl group, a hexyl group, and the like.

As used herein, "cycloalkyl group" refers to a monovalent hydrocarbon cyclic group in which the atoms of the cycle are carbon, for example a cyclopropyl group, a cyclobutyl group, a cyclopentyl group, or a cyclohexyl group.

As used herein, when a definition is not otherwise provided, "cyano-containing group" refers to a monovalent group such as a C1 to C30 alkyl group, a C2 to C30 alkenyl group, or a C2 to C30 alkynyl group where at least one hydrogen is substituted with a cyano group. As used herein, when a definition is not otherwise provided, the cyano-containing group also refers to a divalent functional group such as $=CR^{x}-(CR^{x}R^{y})_{p}-CR^{y}(CN)_{2}$ wherein $R^x$, $R^y$, $R^{x'}$, and $R^{y'}$ are independently hydrogen or a C1 to C10 alkyl group and p is an integer of 0 to 10 (or 1 to 10). In some example embodiments, the cyano-containing group may be a dicyanomethyl group, a dicyanovinyl group, a cyanoethynyl group, and the like. As used herein, the cyano-containing group does not include a functional group including a cyano group (—CN) alone.

As used herein, when a definition is not otherwise provided, "combination thereof" refers to at least two substituents bound to each other by a single bond or a C1 to C10 alkylene group, or at least two fused substituents.

As used herein, when a definition is not otherwise provided, "aromatic hydrocarbon group" may be a C5 to C30 aromatic hydrocarbon group, for example a C6 to C30 aryl group or a C6 to C20 aryl group and "hetero aromatic hydrocarbon group" may be a C2 to C30 heteroaryl group or a C2 to C20 heteroaryl group, which provides a conjugated structure inside the ring.

As used herein, "aryl group" refers to a substituent including all element of the functional group having p-orbitals which form conjugation, and may be a monocyclic, polycyclic or fused-ring polycyclic (e.g., rings sharing adjacent pairs of carbon atoms) functional group. For example, the aryl group may include, for example, a phenyl group, a naphthyl group, and the like, and may include a form in which two or more hydrocarbon aromatic moieties are linked through a sigma bond, for example, a biphenyl group, a terphenyl group, a quaterphenyl group, and the like, and a form in which two or more hydrocarbon aromatic moieties are directly or indirectly fused or two or more hydrocarbon aromatic moieties are fused via a non-aromatic ring such as fluorenyl group.

It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being the "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Hereinafter, a blue light absorbing film according to some example embodiments includes a compound represented by Chemical Formula 1.

[Chemical Formula 1]

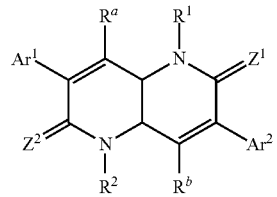

In Chemical Formula 1, $Ar^1$ and $Ar^2$ may each independently be a substituted or unsubstituted C5 to C30 aromatic hydrocarbon group or a substituted or unsubstituted C3 to C30 hetero aromatic hydrocarbon group, $Z^1$ and $Z^2$ may each independently be O, S, Se, Te, or $C(CN)_2$, $R^1$ and $R^2$ may each independently be a substituted or unsubstituted C6 to C40 alkyl group, a substituted or unsubstituted C3 to C30 cycloalkyl group, a substituted or unsubstituted C3 to C30 heterocycloalkyl group, a substituted or unsubstituted C6 to C30 aryl group, or a substituted or unsubstituted C3 to C30 heteroaryl group, and $R^a$ and $R^b$ may each independently be hydrogen, deuterium, a halogen (F, Cl, Br, or I), a cyano group (—CN), or a C1 to C10 alkyl group.

$Ar^1$ and $Ar^2$ may be a C5 to C30 aromatic hydrocarbon group or a substituted or unsubstituted C3 to C30 heteroaromatic hydrocarbon group, which includes a conjugated structure in a ring. The aromatic hydrocarbon group may be a substituted or unsubstituted C6 to C30 aryl group, a substituted or unsubstituted C3 to C30 heteroaryl group, or a fused ring thereof, for example, a substituted or unsubstituted C6 to C20 aryl group, a substituted or unsubstituted C3 to C20 heteroaryl group or a fused ring thereof.

In Chemical Formula 1, the substituted or unsubstituted C5 to C30 aromatic hydrocarbon group may be a substituted or unsubstituted phenyl group, a substituted or unsubstituted naphthyl group, a substituted or unsubstituted anthracenyl group, a substituted or unsubstituted phenanthrenyl group, a substituted or unsubstituted naphthacenyl group, a substituted or unsubstituted pyrenyl group, a substituted or unsubstituted biphenyl group, a substituted or unsubstituted p-terphenyl group, a substituted or unsubstituted m-terphenyl group, a substituted or unsubstituted o-terphenyl group, a substituted or unsubstituted chrysenyl group, a substituted or unsubstituted triphenylenyl group, a substituted or unsubstituted perylenyl group, a substituted or unsubstituted fluorenyl group, or a substituted or unsubstituted indenyl group.

In Chemical Formula 1, the substituted or unsubstituted C3 to C30 hetero aromatic hydrocarbon group may be a substituted or unsubstituted furanyl group, a substituted or unsubstituted thienyl group, a substituted or unsubstituted selenophenyl group, a substituted or unsubstituted pyrrolyl group, a substituted or unsubstituted pyrazolyl group, a substituted or unsubstituted imidazolyl group, a substituted or unsubstituted triazolyl group, a substituted or unsubstituted oxazolyl group, a substituted or unsubstituted isoxazolyl group, a substituted or unsubstituted thiazolyl group, a substituted or unsubstituted isothiazolyl group, a substituted or unsubstituted oxadiazolyl group, a substituted or unsubstituted thiadiazolyl group, a substituted or unsubstituted pyridyl group, a substituted or unsubstituted pyridinyl group, a substituted or unsubstituted pyridyl group, a substituted or unsubstituted pyrimidinyl group, a substituted or unsubstituted pyrazinyl group, a substituted or unsubstituted triazinyl group, a substituted or unsubstituted benzofuranyl group, a substituted or unsubstituted benzothiophenyl group, a substituted or unsubstituted benzimidazolyl group, a substituted or unsubstituted indolyl group, a substituted or unsubstituted quinolinyl group, a substituted or unsubstituted isoquinolinyl group, a substituted or unsubstituted quinazolinyl group, a substituted or unsubstituted phthalazinyl group, a substituted or unsubstituted quinoxalinyl group, a substituted or unsubstituted naphthyridinyl group, a substituted or unsubstituted cinnolinyl group, a substituted or unsubstituted benzoxazinyl group, a substituted or unsubstituted benzthiazinyl group, a substituted or unsubstituted acridinyl group, a substituted or unsubstituted phenazinyl group, a substituted or unsubstituted phenothiazinyl group, a substituted or unsubstituted phenoxazinyl group, a substituted or unsubstituted dibenzofuranyl group, a substituted or unsubstituted dibenzothiophenyl group, a substituted or unsubstituted benzotriazinyl group, a substituted or unsubstituted pyridopyrazinyl group, a substituted or unsubstituted pyridopyrimidinyl, a substituted or unsubstituted pyridopyridazinyl group, a substituted or unsubstituted benzothienyl group, or a substituted or unsubstituted benzoselenophenyl group.

In Chemical Formula 1, the substituted or unsubstituted C5 to C30 aromatic hydrocarbon group may be one of functional groups of Chemical Formula 1-1.

[Chemical Formula 1-1]

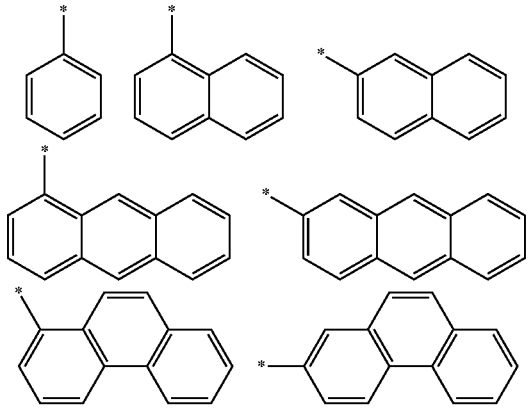

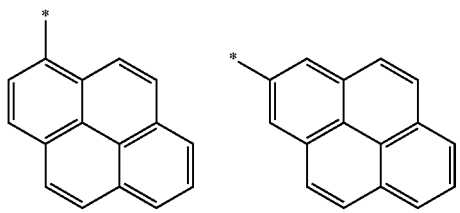

In Chemical Formula 1-1, a hydrogen of —CH— of each aromatic ring may be replaced by a substituent of a substituted or unsubstituted C1 to C20 alkyl group, a substituted or unsubstituted C1 to C20 alkoxy group, a substituted or unsubstituted C6 to C10 aryl group, a substituted or unsubstituted C4 to C10 heteroaryl group, a halogen (F, Cl, Br, or I), a cyano group (—CN), a cyano-containing group, or a combination thereof, and

* indicates a linking position.

In Chemical Formula 1, the substituted or unsubstituted C3 to C30 hetero aromatic hydrocarbon group may be one of functional groups represented by Chemical Formula 1-2.

[Chemical Formula 1-2]

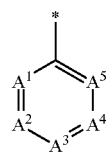
(1)

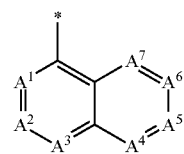
(2)

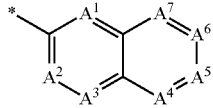
(3)

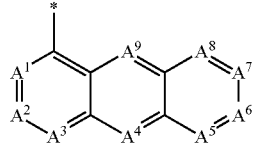
(4)

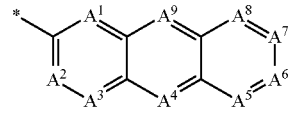
(5)

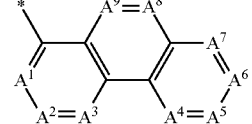
(6)

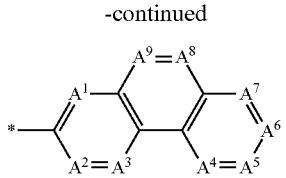
(7)

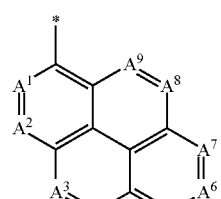
(8)

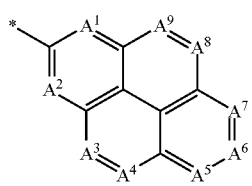
(9)

In Chemical Formula 1-2,
A$^1$ to A$^9$ may each independently be N or CR$^k$, wherein, R$^k$ may be hydrogen, deuterium, a substituted or unsubstituted C1 to C20 alkyl group, a substituted or unsubstituted C1 to C20 alkoxy group, a substituted or unsubstituted C6 to C10 aryl group, a substituted or unsubstituted C4 to C10 heteroaryl group, a halogen (F, Cl, Br, or I), a cyano group (—CN), a cyano-containing group, or a combination thereof, 1 to 3 of A$^1$ to A$^5$ of Chemical Formula (1) of Chemical Formula 1-2 may be N, 1 to 3 of A$^1$ to A$^7$ of Chemical Formulas (2) and (3) of Chemical Formula 1-2 may be N, 1 to 4 of A$^1$ to A$^9$ of Chemical Formulas (4) to (9) of Chemical Formula 1-2 may be N, and

* indicates a linking position.

In Chemical Formula 1, the substituted or unsubstituted C5 to C30 aromatic hydrocarbon group may be one of functional groups represented by Chemical Formula 1-3.

[Chemical Formula 1-3]

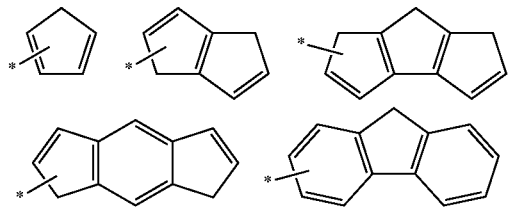

In Chemical Formula 1-3,
a hydrogen of —CH— of each aromatic ring may be replaced by a substituent of a substituted or unsubstituted C1 to C20 alkyl group, a substituted or unsubstituted C1 to C20 alkoxy group, a substituted or unsubstituted C6 to C10 aryl group, a substituted or unsubstituted C4 to C10 heteroaryl group, a halogen (F, Cl, Br, or I), a cyano group (—CN), a cyano-containing group, or a combination thereof, and
* indicates a linking position.

In Chemical Formula 1, the substituted or unsubstituted C3 to C30 hetero aromatic hydrocarbon group may be one of functional groups represented by Chemical Formula 1-4.

[Chemical Formula 1-4]

(1)

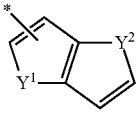
(2)

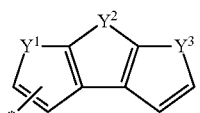
(3)

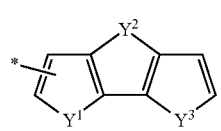
(4)

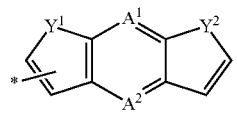
(5)

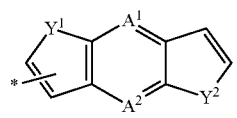
(6)

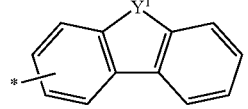
(7)

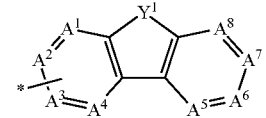
(8)

In Chemical Formula 1-4,
Y$^1$ to Y$^3$ may each independently be O, S, Se, Te, or NR$^a$, wherein, R$^a$ is hydrogen, deuterium, or a substituted or unsubstituted C1 to C10 alkyl group,
A$^1$ to A$^8$ may each independently be N or CR$^k$, wherein R$^k$ is hydrogen, deuterium, a substituted or unsubstituted C1 to C20 alkyl group, a substituted or unsubstituted C1 to C20 alkoxy group, a substituted or unsubstituted C6 to C10 aryl group, a substituted or unsubstituted C4 to C10 heteroaryl group, a halogen (F, Cl, Br, or I), a cyano group (—CN), a cyano-containing group, or a combination thereof,
a hydrogen of —CH— of each aromatic ring may be replaced by a substituent of a substituted or unsubstituted C1 to C20 alkyl group, a substituted or unsubstituted C1 to C20 alkoxy group, a substituted or unsubstituted C6 to C10 aryl group, a substituted or unsubstituted C4 to C10 heteroaryl group, a halogen (F, Cl, Br, or I), a cyano group (—CN), a cyano-containing group, or a combination thereof, and in Chemical Formula (8) of Chemical Formula 1-4, one of $A^1$ to $A^4$ may be a linking portion, and at least one of $A^1$ to $A^8$ may be nitrogen (N), and

* indicates a linking position.

In Chemical Formula 1, $R^1$ and $R^2$ may each independently be a substituted or unsubstituted C6 to C40 alkyl group, for example a substituted or unsubstituted C6 to C30 alkyl group; a substituted or unsubstituted C3 to C30 cycloalkyl group, for example a substituted or unsubstituted C3 to C20 cycloalkyl group; a substituted or unsubstituted C3 to C30 heterocycloalkyl group, for example a substituted or unsubstituted C3 to C20 heterocycloalkyl group; a substituted or unsubstituted C6 to C30 aryl group, for example a substituted or unsubstituted C6 to C30 aryl group; or a substituted or unsubstituted C3 to C30 heteroaryl group, for example a substituted or unsubstituted C3 to C20 heteroaryl group. The $R^1$ and $R^2$ may serve to prevent stacking between compounds when forming a thin film using the aforementioned compound. When $R^1$ and $R^2$ include a polar group such as an amine group or an ester group, the absorption wavelength may shift to a longer wavelength and may not include blue absorption characteristics, so these polar groups may not be included.

In Chemical Formula 1, $Z^1$ and $Z^2$ may be the same or different from each other.

Specific examples of the compound represented by Chemical Formula 1 may include, but are not limited to, compounds of Group 1.

[Group 1]

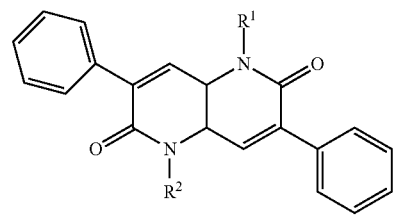

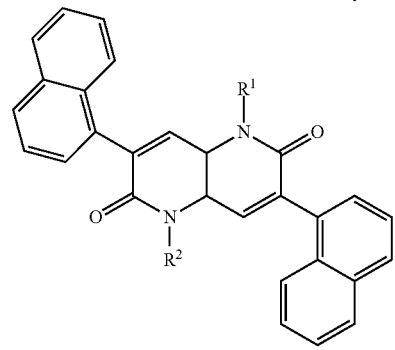

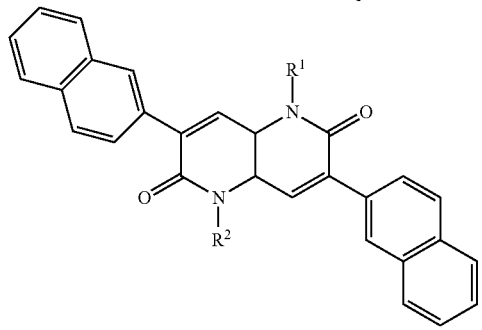

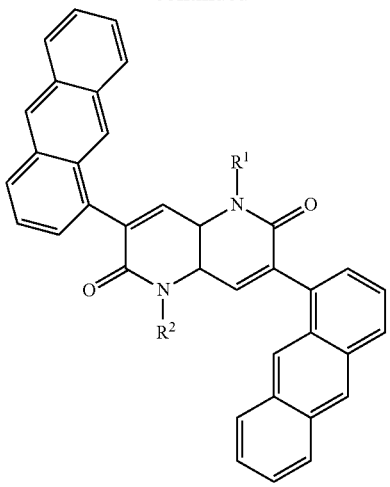

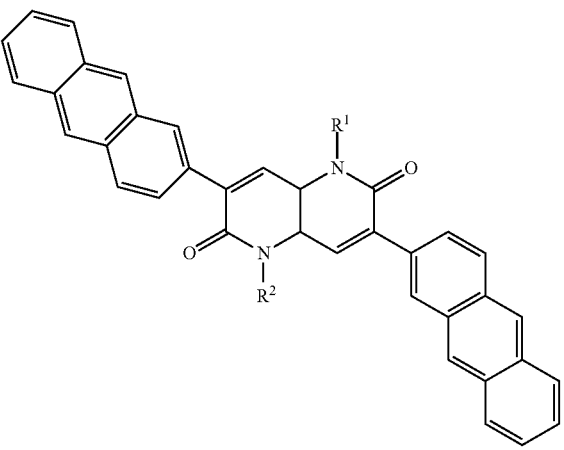

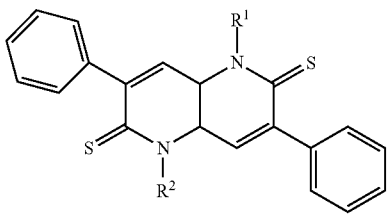

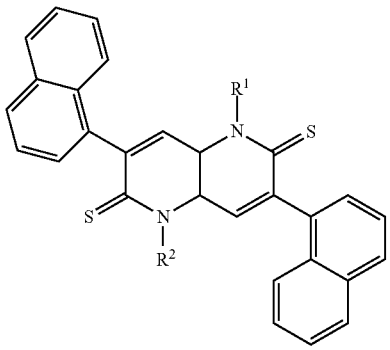

-continued
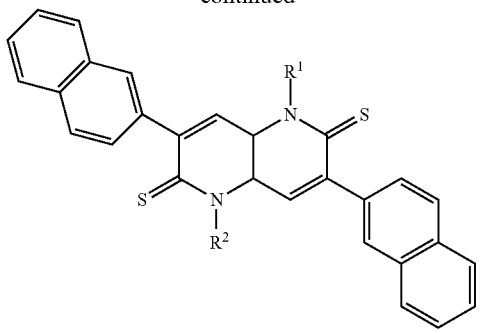
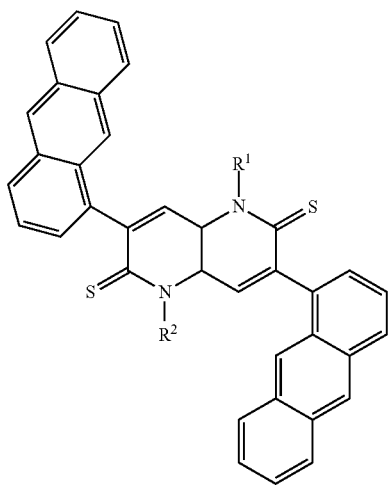
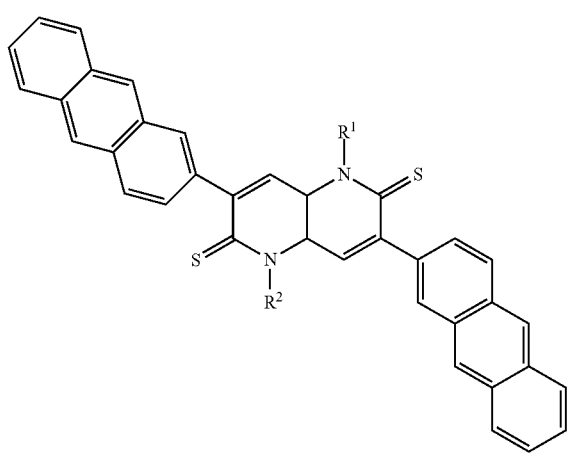
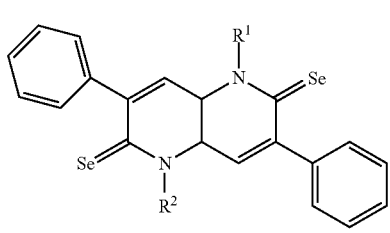
-continued
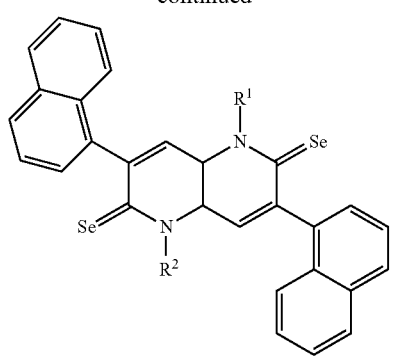
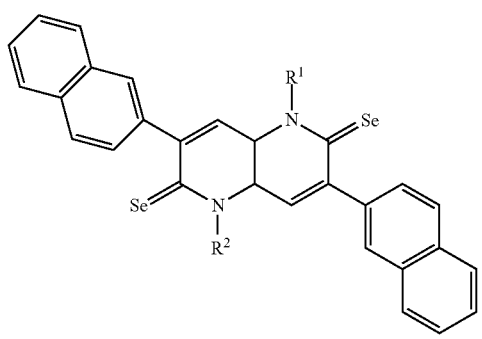
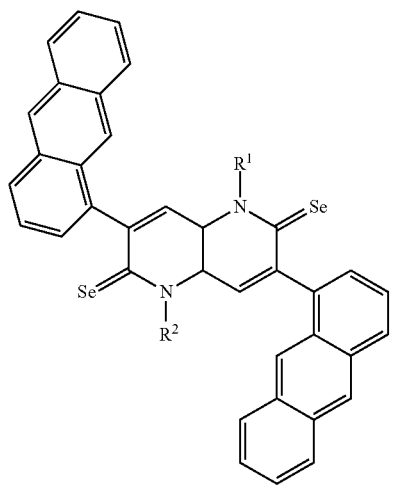
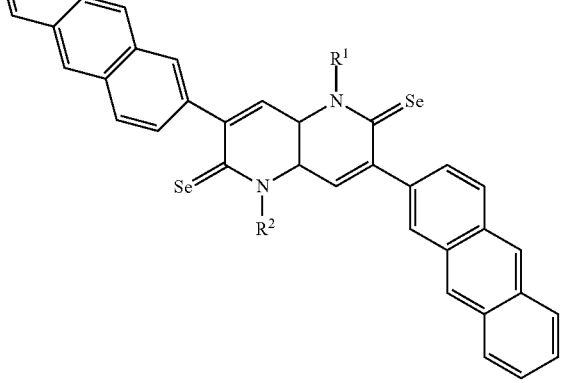

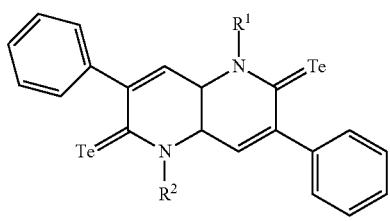

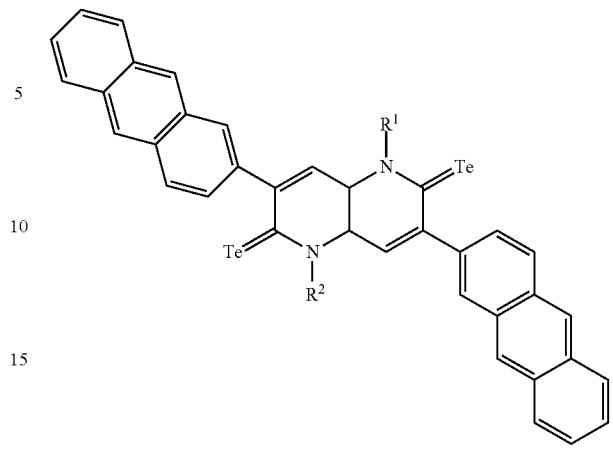

In Group 1,

R[1] and R[2] may each independently be a substituted or unsubstituted C6 to C40 alkyl group, for example a substituted or unsubstituted C6 to C30 alkyl group; a substituted or unsubstituted C3 to C30 cycloalkyl group, for example a substituted or unsubstituted C3 to C20 cycloalkyl group; a substituted or unsubstituted C3 to C30 heterocycloalkyl group, for example a substituted or unsubstituted C3 to C20 heterocycloalkyl group; a substituted or unsubstituted C6 to C30 aryl group, for example a substituted or unsubstituted C6 to C30 aryl group; or a substituted or unsubstituted C3 to C30 heteroaryl group, for example a substituted or unsubstituted C3 to C20 heteroaryl group.

Specific examples of the compound represented by Chemical Formula 1 may include, but are not limited to, compounds of Group 2.

[Group 2]

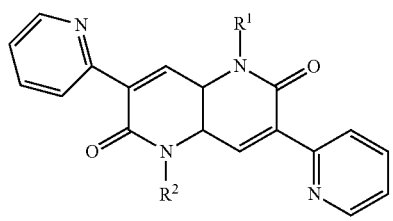

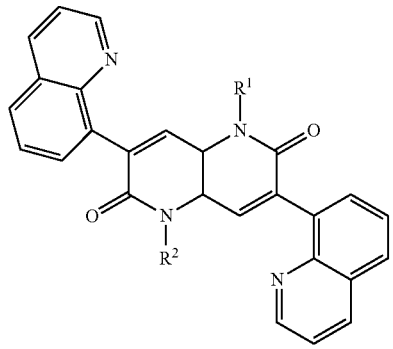

-continued
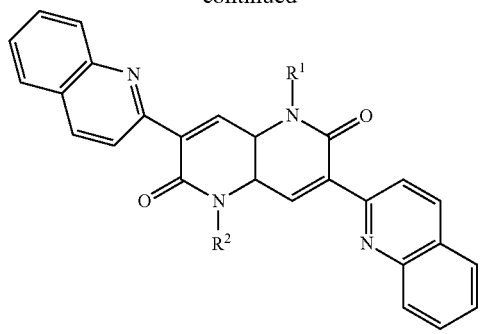
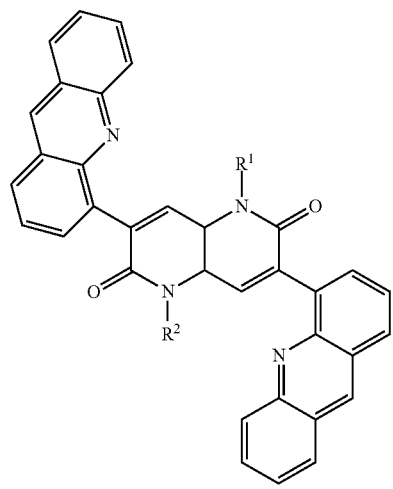
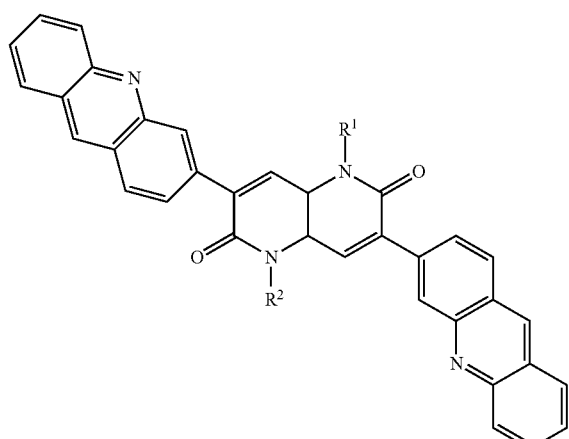
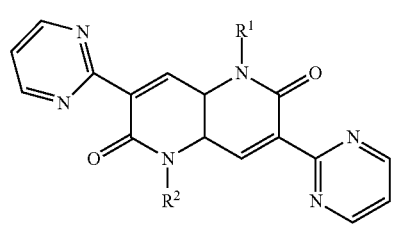
-continued
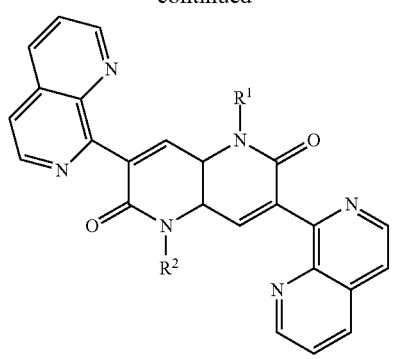
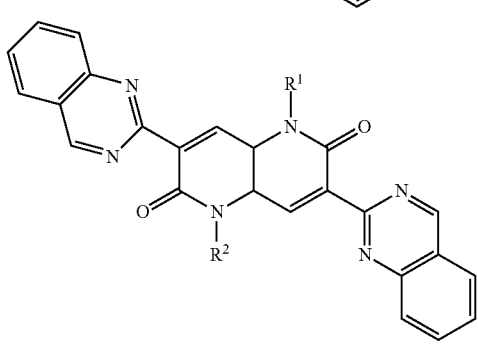
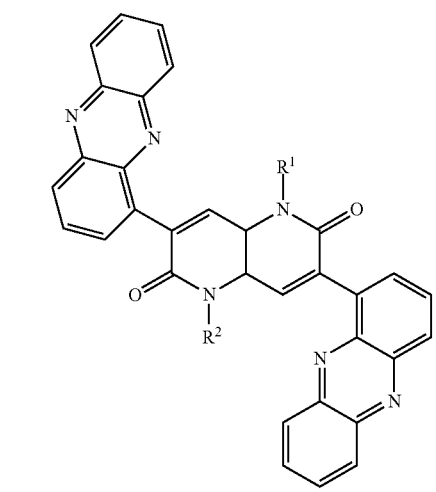
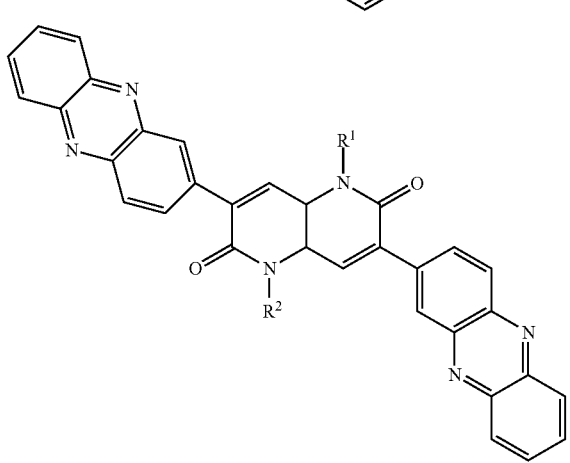

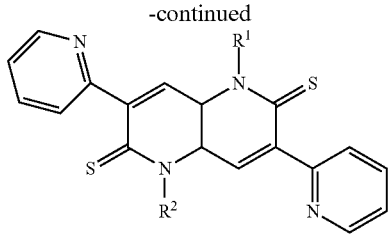
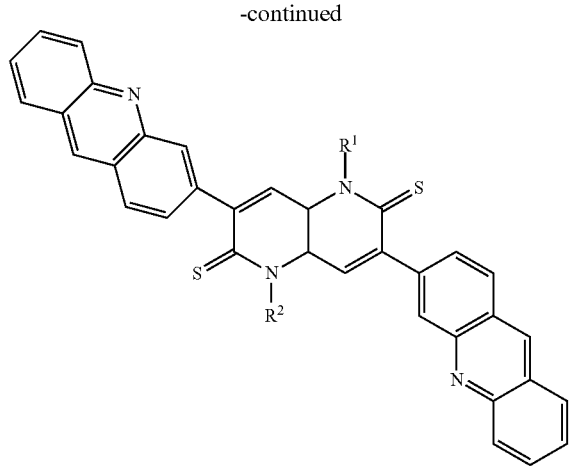
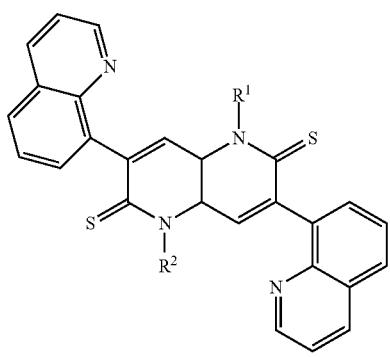
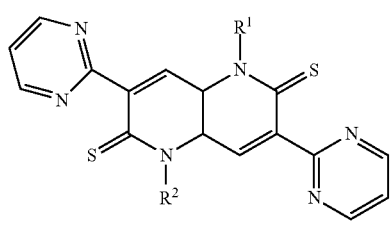
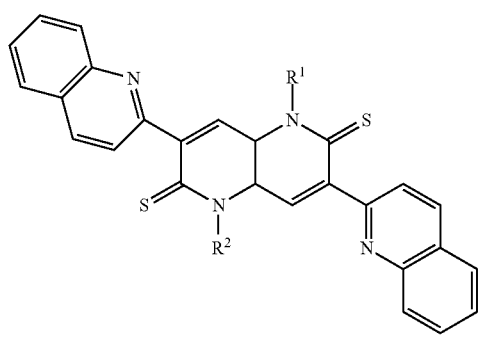
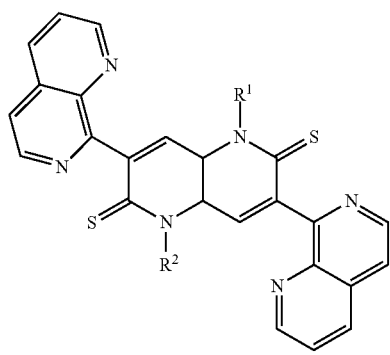
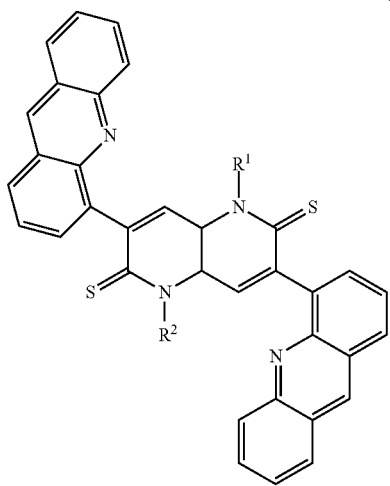
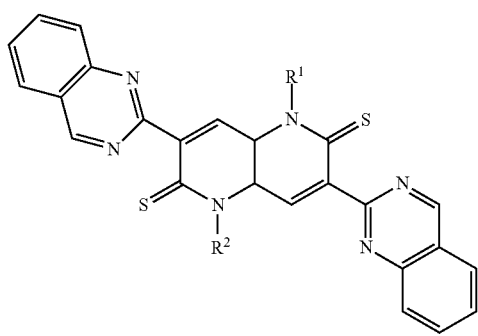

25
-continued
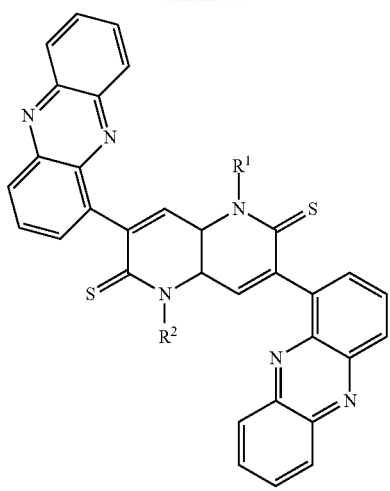
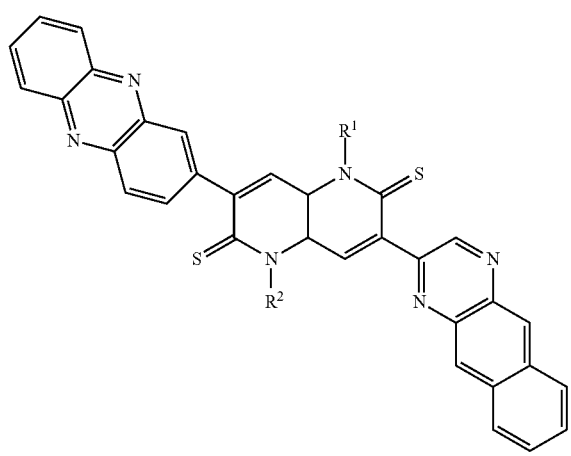
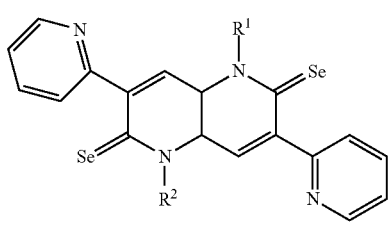
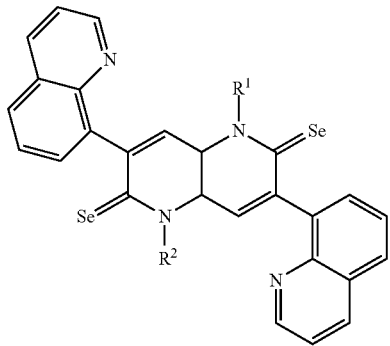
26
-continued
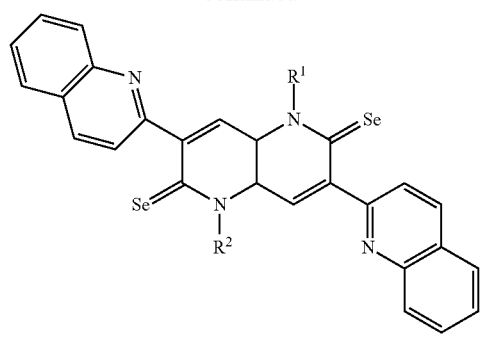
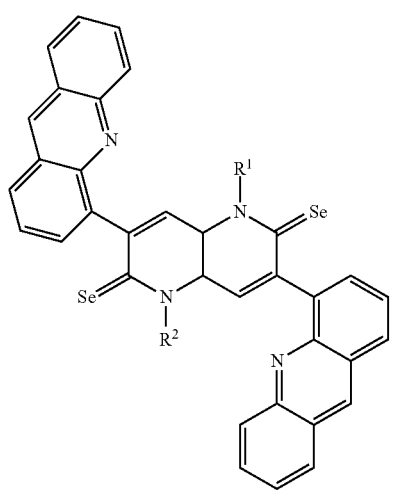
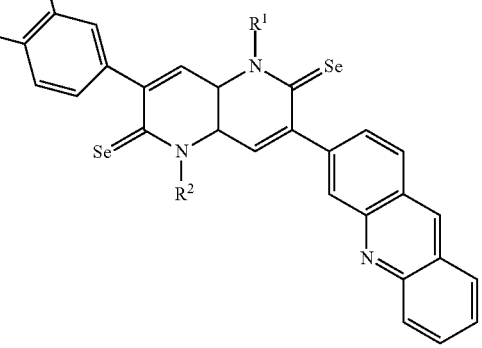
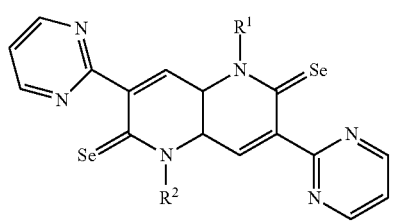

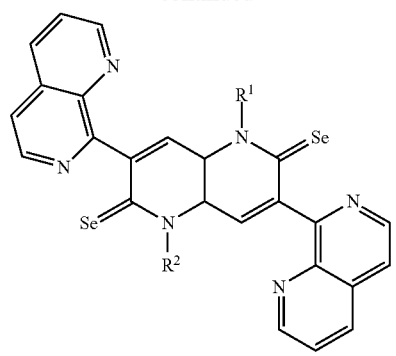
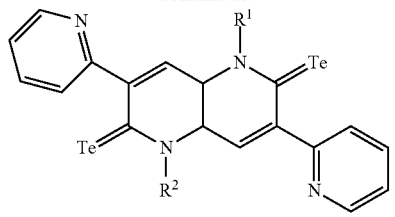
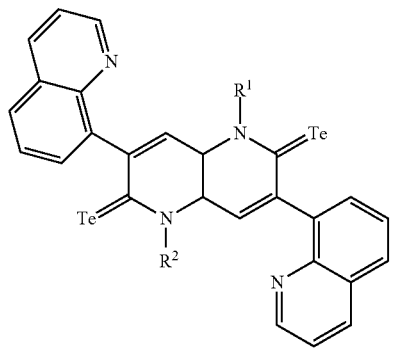
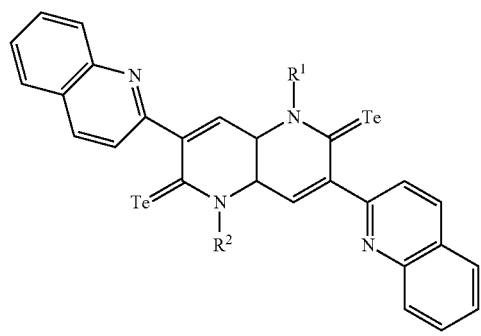
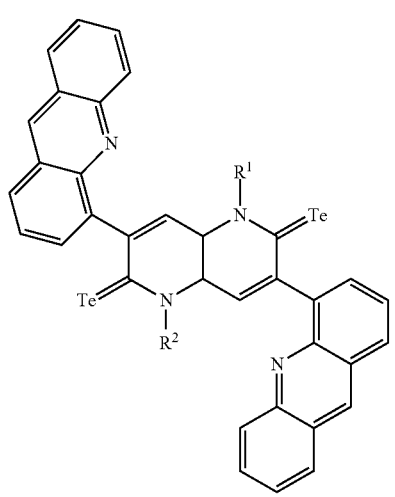

-continued

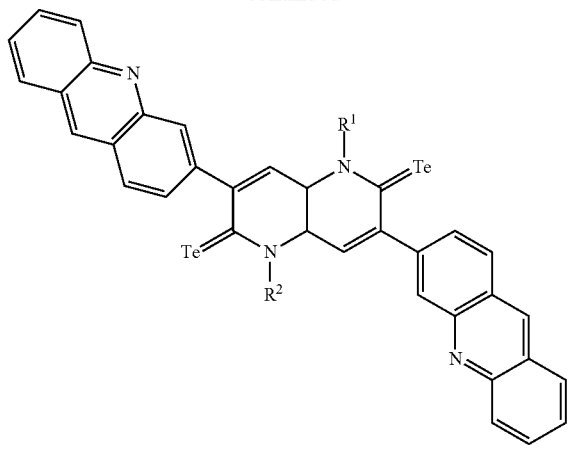
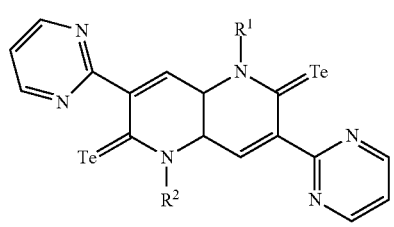
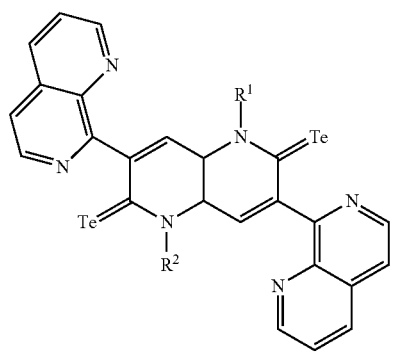
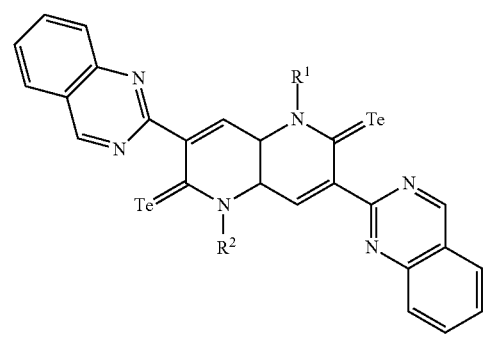

-continued

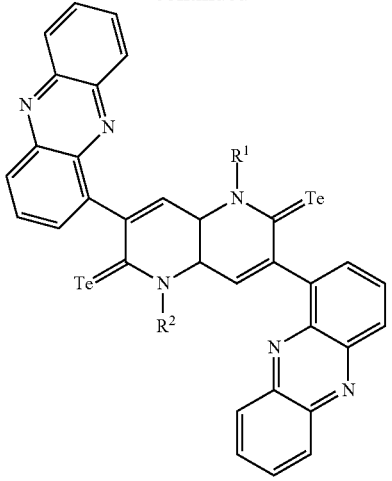
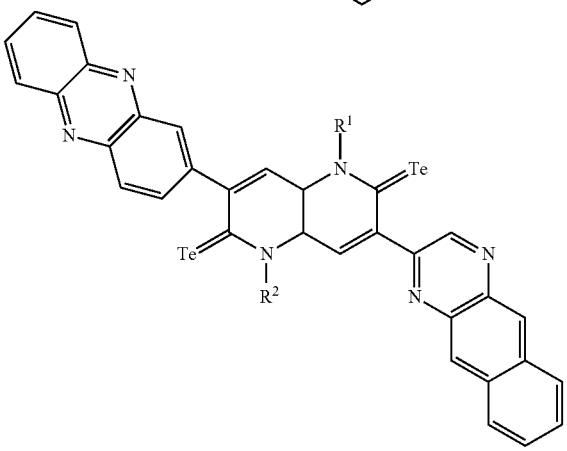

In Group 2, $R^1$ and $R^2$ may each independently be a substituted or unsubstituted C6 to C40 alkyl group, for example a substituted or unsubstituted C6 to C30 alkyl group; a substituted or unsubstituted C3 to C30 cycloalkyl group, for example a substituted or unsubstituted C3 to C20 cycloalkyl group; a substituted or unsubstituted C3 to C30 heterocycloalkyl group, for example a substituted or unsubstituted C3 to C20 heterocycloalkyl group; a substituted or unsubstituted C6 to C30 aryl group, for example a substituted or unsubstituted C6 to C30 aryl group; or a substituted or unsubstituted C3 to C30 heteroaryl group, for example a substituted or unsubstituted C3 to C20 heteroaryl group.

The compound may selectively absorb light in a specific wavelength region, and may exhibit (and a film including the compound may exhibit) an absorption curve having a full width at half maximum (FWHM) of about 50 nm to about 90 nm, specifically, about 50 nm to about 85 nm in a thin film state. Herein, the FWHM is a width of a wavelength corresponding to half of a maximum absorption point. As used herein, when specific definition is not otherwise provided, it may be defined by absorbance measured by UV-Vis spectroscopy. When the full width at half maximum (FWHM) is within the range, selectivity in a blue wavelength region may be increased. The thin film may be a thin film deposited under a vacuum condition.

The compound may be formed into a thin film by vapor deposition. The deposition method may provide a uniform thin film and have small inclusion possibility of impurities into the thin film, but when the compound has a lower melting point than a temperature for the deposition, a product decomposed from the compound may be deposited and thus performance of a device may be deteriorated. Accordingly, the compound may desirably have a higher melting point than the deposition temperature. In this respect, the compound has a melting point higher than the deposition temperature. Because a difference between the melting point and the deposition temperature may be for example greater than or equal to about 10° C., for example greater than or equal to about 20° C., or greater than or equal to about 30° C.

In addition, during repetitive deposition, decomposition products may remain, which may have unfavorable effects on performance of a device. However, the compound may not produce decomposition products and thus may improve process stability.

In addition, a micro lens array (MLA) needs to be formed to concentrate light after manufacturing a photoelectric device during manufacture of an image sensor. This micro lens array requires a relatively high temperature (about 160° C. or greater), and this annealing process may deteriorate performance of the photoelectric device. The performance deterioration of the photoelectric device during the annealing process of MLA may be caused not by chemical decomposition of an organic material but its morphology change. The morphology change is in general caused, when a material starts a thermal vibration due to the annealing process, but a material having a firm molecular structure may not have the thermal vibration and be prevented from the deterioration by the annealing process. The compound may be suppressed from the thermal vibration of molecules due to a conjugated structure in a donor region and stably maintained during the MLA annealing process and thus secure process stability.

The compound may be a p-type semiconductor compound. Since the compound works as a p-type semiconductor, the compound may be appropriately used, as long as it has a higher LUMO level than an n-type semiconductor. For example, when the compound is mixed with an n-type material such as fullerene, the compound desirably has a higher LUMO level than 4.2 eV than the fullerene having a LUMO level of 4.2 eV. As for the desirable HOMO-LUMO level of the compound, when the compound may have a HOMO level ranging from about 5.0 eV to about 5.9 eV, and an energy bandgap ranging from about 1.9 eV to about 2.3 eV, the LUMO level of the compound may be in a range of about 2.7 eV to about 4.0 eV. The compound having a HOMO level, an LUMO level, and an energy bandgap within the ranges may be used as a p-type semiconductor compound effectively absorbing light in a green wavelength region, and thus has high external quantum efficiency (EQE) and resultantly improves photoelectric conversion efficiency.

In some example embodiments, in view of a thin film formation, a stably depositable compound is desirable and thus the compound has a molecular weight of about 300 g/mol to about 1500 g/mol. However, even though the compound has a molecular weight out of the range, any sublimable (depositable) compound may be used without limitation. In addition, when the compound is formed to form a thin film using a coating process, any compound that is dissolved in a solvent and coated may be used without limitation.

Hereinafter, a photoelectric device including the compound according to some example embodiments is described with reference to drawings FIG. 1 is a cross-sectional view showing a photoelectric device according to some example embodiments.

Referring to FIG. 1, a photoelectric device 100 according to some example embodiments includes a first electrode 10 and a second electrode 20, and an active layer 30 between the first electrode 10 and the second electrode 20.

One of the first electrode 10 or the second electrode 20 is an anode and the other is a cathode. At least one of the first electrode 10 or the second electrode 20 may be a light-transmitting electrode, and the light-transmitting electrode may be made of, for example, a transparent conductor such as indium tin oxide (ITO) or indium zinc oxide (IZO), or a metal thin layer of a thin single layer or multilayer. When one of the first electrode 10 or the second electrode 20 is a non-light-transmitting electrode, it may be made of, for example, an opaque conductor such as aluminum (Al).

The active layer 30 includes a p-type semiconductor and an n-type semiconductor to form a pn junction and absorbs external light to generate excitons and then separates the generated excitons into holes and electrons.

The active layer 30 includes the compound represented by Chemical Formula 1. The compound may act as a p-type semiconductor compound in the active layer 30.

The compound is a compound configured to selectively absorb light in a blue wavelength region, and the active layer 30 including the compound may have a maximum absorption wavelength (λmax) in a wavelength region of less than about 500 nm, specifically greater than or equal to about 400 nm, for example greater than or equal to about 410 nm, or greater than or equal to about 420 nm and less than or equal to about 480 nm, for example less than or equal to about 470 nm, or less than or equal to about 460 nm. For example, the compound, active layer 30, and/or a film including the compound (e.g., a film comprising active layer 30) may exhibit an absorption curve having a central wavelength of less than or equal to about 460 nm.

The active layer 30 may exhibit a light absorption curve having a relatively narrow full width at half maximum (FWHM) of about 50 nm to about 90 nm, specifically about 50 nm to about 85 nm. Accordingly, the active layer 30 may have high selectivity for light in a blue wavelength region.

The active layer 30 may have an absorption coefficient of greater than or equal to about $5.5 \times 10^4$ cm$^{-1}$, for example about $5.8 \times 10^4$ cm$^{-1}$ to about $10 \times 10^4$ cm$^{-1}$ or about $7.0 \times 10^4$ cm$^{-1}$ to about $10 \times 10^4$ cm$^{-1}$ when the active layer 30 includes in a volume ratio of about 0.9:1 to about 1.1:1, for example about 1:1.

The active layer 30 may further include an n-type semiconductor compound for forming pn junction.

The n-type semiconductor compound may be sub-phthalocyanine or a sub-phthalocyanine derivative, fullerene or a fullerene derivative, thiophene or a thiophene derivative, or a combination thereof.

The fullerene may include C60, C70, C76, C78, C80, C82, C84, C90, C96, C240, C540, a mixture thereof, a fullerene nanotube, and the like. The fullerene derivative may refer to compounds of these fullerenes having a substituent thereof. The fullerene derivative may include a substituent such as an alkyl group (e.g., C1 to C30 alkyl group), an aryl group (e.g., C6 to C30 aryl group), a heterocyclic group (e.g., C3 to C30 cycloalkyl group), and the like. Examples of the aryl groups and heterocyclic groups may be are a benzene ring, a naphthalene ring, an anthracene ring, a phenanthrene ring, a fluorene ring, a triphenylene ring, a naphthacene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a benzimidazole ring, an imidazopyridine ring, a quinolizidine ring, a quinoline ring, a phthalazine ring, a naphthyridine ring, a quinoxaline ring, a quinoxazoline ring, a quinazoline ring, an isoquinoline ring, a carbazole ring, a phenanthridine ring, an acridine ring, a phenanthroline ring, a thianthrene ring, a chromene ring, an xanthene ring, a phenoxazine ring, a phenoxathin ring, a phenothiazine ring, or a phenazine ring.

The sub-phthalocyanine or the sub-phthalocyanine derivative may be represented by Chemical Formula 2.

[Chemical Formula 2]

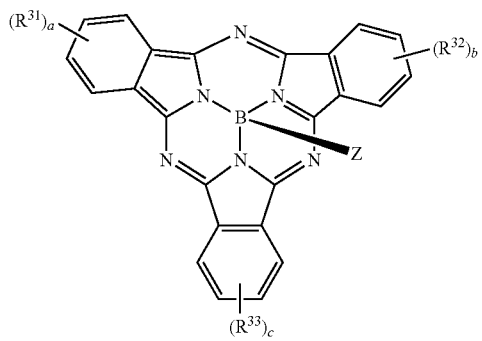

In Chemical Formula 2, $R^{31}$ to $R^{33}$ may each independently be hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a halogen-containing group, or a combination thereof, a, b, and c may be integers of 1 to 3, and Z may be a monovalent substituent.

For example, Z may be a halogen or a halogen-containing group, for example F, Cl, an F-containing group, or a Cl-containing group.

The halogen refers to F, Cl, Br, or I and the halogen-containing group refers to an alkyl group (C1 to C30 alkyl group) where at least one hydrogen of the alkyl group is replaced by F, Cl, Br, or I.

The thiophene derivative may be for example represented by Chemical Formula 3 or Chemical Formula 4, but is not limited thereto.

[Chemical Formula 3]

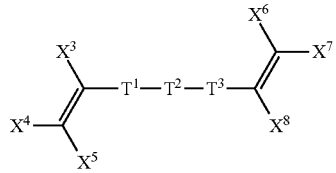

[Chemical Formula 4]

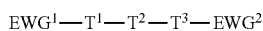

In Chemical Formulas 3 and 4, $T^1$, $T^2$, and $T^3$ may be aromatic rings including substituted or unsubstituted thiophene moieties, $T^1$, $T^2$, and $T^3$ may each independently be present or may be fused to each other, $X^3$ to $X^8$ may each independently be hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heterocyclic group, a cyano group, or a combination thereof, and $EWG^1$ and $EWG^2$ may each independently be electron withdrawing groups.

For example, in Chemical Formula 3, at least one of $X^3$ to $X^8$ may be an electron withdrawing group, for example a cyano-containing group.

The active layer 30 may be a single layer or a multilayer. The active layer 30 may be, for example, an intrinsic layer (I layer), a p-type layer/I layer, an I layer/n-type layer, a p-type layer/I layer/n-type layer, a p-type layer/n-type layer, and the like.

The intrinsic layer (I layer) may include the compound of Chemical Formula 1 and the n-type semiconductor compound in a volume ratio of about 1:100 to about 100:1. The compound of Chemical Formula 1 and the n-type semiconductor compound may be included in a volume ratio ranging from about 1:50 to about 50:1 within the range, specifically, about 1:10 to about 10:1, and more specifically, about 1:1. When the compound of Chemical Formula 1 and the n-type semiconductor compound have a volume ratio within the range, an exciton may be effectively produced, and a pn junction may be effectively formed.

The p-type layer may include the semiconductor compound of Chemical Formula 1, and the n-type layer may include the n-type semiconductor compound.

The active layer 30 may have a thickness of about 1 nm to about 500 nm and specifically, about 5 nm to about 300 nm. When the active layer 30 has a thickness within the range, the active layer may effectively absorb light, effectively separate holes from electrons, and deliver them, thereby effectively improving photoelectric conversion efficiency. A desirable thickness of the active layer 30 may be, for example, determined by an absorption coefficient of the active layer 30, and may be, for example, a thickness being capable of absorbing light of at least about 70% or more, for example about 80% or more, and for another example about 90%.

In the photoelectric device 100, when light enters from the first electrode 10 and/or second electrode 20, and when the active layer 30 absorbs light in a predetermined wavelength region, excitons may be produced from the inside. The excitons are separated into holes and electrons in the active layer 30, and the separated holes are transported to an anode that is one of the first electrode 10 or the second electrode 20 and the separated electrons are transported to the cathode that is the other of and the first electrode 10 and the second electrode 20 so as to flow a current in the photoelectric device.

Hereinafter, a photoelectric device according to some example embodiments is described with reference to FIG. 2.

Figure 2:
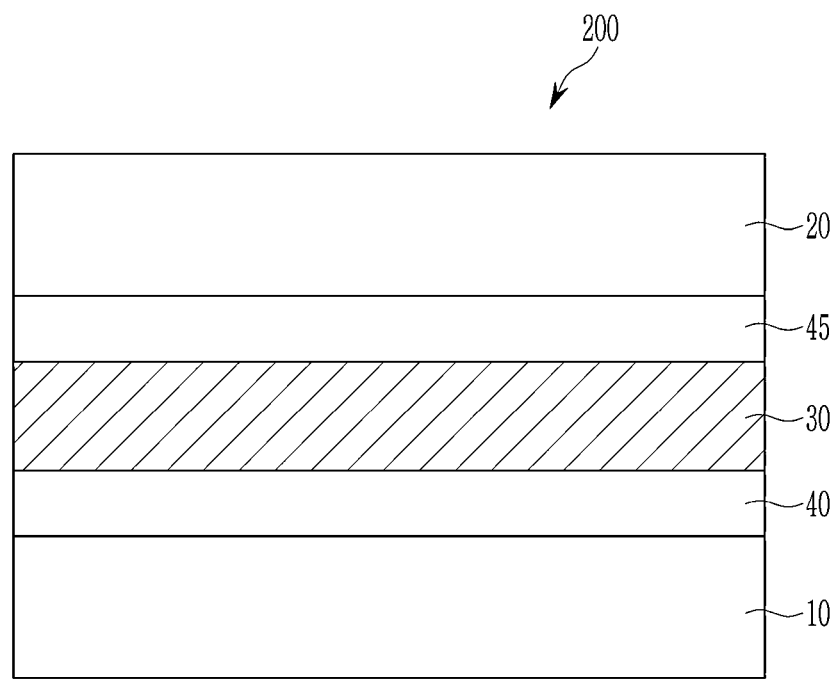
FIG. 2 is a cross-sectional view showing a photoelectric device according to some example embodiments.

FIG. 2 is a cross-sectional view showing a photoelectric device according to some example embodiments.

Referring to FIG. 2, a photoelectric device 200 according to some example embodiments, including the example embodiments shown in FIG. 2 includes a first electrode 10 and a second electrode 20 facing each other, and an active layer 30 between the first electrode 10 and the second electrode 20, like some example embodiments, including the example embodiments shown in FIG. 1.

However, the photoelectric device 200 according to some example embodiments, including the example embodiments shown in FIG. 2 further includes charge auxiliary layers 40 and 45 between the first electrode 10 and the active layer 30, and the second electrode 20 and the active layer 30, unlike some example embodiments, including the example embodiments shown in FIG. 1. The charge auxiliary layers 40 and 45 may facilitate the transfer of holes and electrons separated from the active layer 30, so as to increase efficiency.

The charge auxiliary layers 40 and 45 may be at least one of a hole injection layer (HIL) for facilitating hole injection, a hole transport layer (HTL) for facilitating hole transport, an electron blocking layer (EBL) for preventing electron transport, an electron injection layer (EIL) for facilitating electron injection, an electron transport layer (ETL) for facilitating electron transport, or a hole blocking layer (HBL) for preventing hole transport.

The charge auxiliary layers 40 and 45 may include, for example, an organic material, an inorganic material, or an organic/inorganic material. The organic material may be an organic compound having hole or electron characteristics, and the inorganic material may be, for example, a metal oxide such as molybdenum oxide, tungsten oxide, nickel oxide, and the like.

The hole transport layer (HTL) may include one of, for example, poly(3,4-ethylenedioxythiophene):poly(styrenesulfonate) (PE DOT: PSS), polyarylamine, poly(N-vinylcarbazole), polyaniline, polypyrrole, N, N, N', N'-tetrakis(4-methoxyphenyl)-benzidine (TPD), 4,4'-bis[N-(1-naphthyl)-N-phenyl-amino]biphenyl (α-NPD), m-MTDATA, 4,4',4"-tris(N-carbazolyl)-triphenylamine (TCTA), or a combination thereof, but is not limited thereto.

The electron blocking layer (EBL) may include one of, for example, poly(3,4-ethylenedioxythiophene): poly(styrenesulfonate) (PE DOT: PSS), polyarylamine, poly(N-vinylcarbazole), polyaniline, polypyrrole, N, N, N', N'-tetrakis(4-methoxyphenyl)-benzidine (TPD), 4,4'-bis[N-(1-naphthyl)-N-phenyl-amino]biphenyl (α-NPD), m-MTDATA, 4,4',4"-tris(N-carbazolyl)-triphenylamine (TCTA), or a combination thereof, but is not limited thereto.

The electron transport layer (ETL) may include one of, for example, 1,4,5,8-naphthalene-tetracarboxylic dianhydride (NTCDA), bathocuproine (BCP), LiF, Alq$_3$, Gaq$_3$, Inq$_3$, Znq$_2$, Zn(BTZ)$_2$, BeBq$_2$, or a combination thereof, but is not limited thereto.

The hole blocking layer (HBL) may include one of, for example, 1,4,5,8-naphthalene-tetracarboxylic dianhydride (NTCDA), bathocuproine (BCP), LiF, Alq$_3$, Gaq$_3$, Inq$_3$, Znq$_2$, Zn(BTZ)$_2$, BeBq$_2$, or a combination thereof, but is not limited thereto.

Either one of the charge auxiliary layers 40 or 45 may be omitted.

The photoelectric device may be applied to various fields, for example a solar cell, an image sensor, a photo-detector, a photo-sensor, and an organic light emitting diode (OLED), but is not limited thereto.

Hereinafter, an example of an image sensor including the organic photoelectric device is described referring to drawings. As an example of an image sensor, an organic CMOS image sensor is described.

Figure 3:
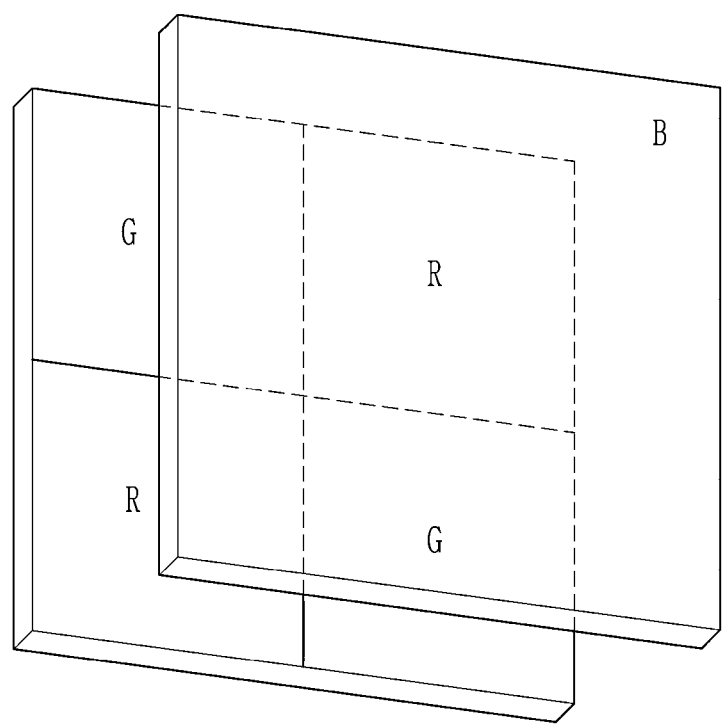
FIG. 3 is a schematic plan view showing an organic CMOS image sensor according to some example embodiments.
Figure 4:
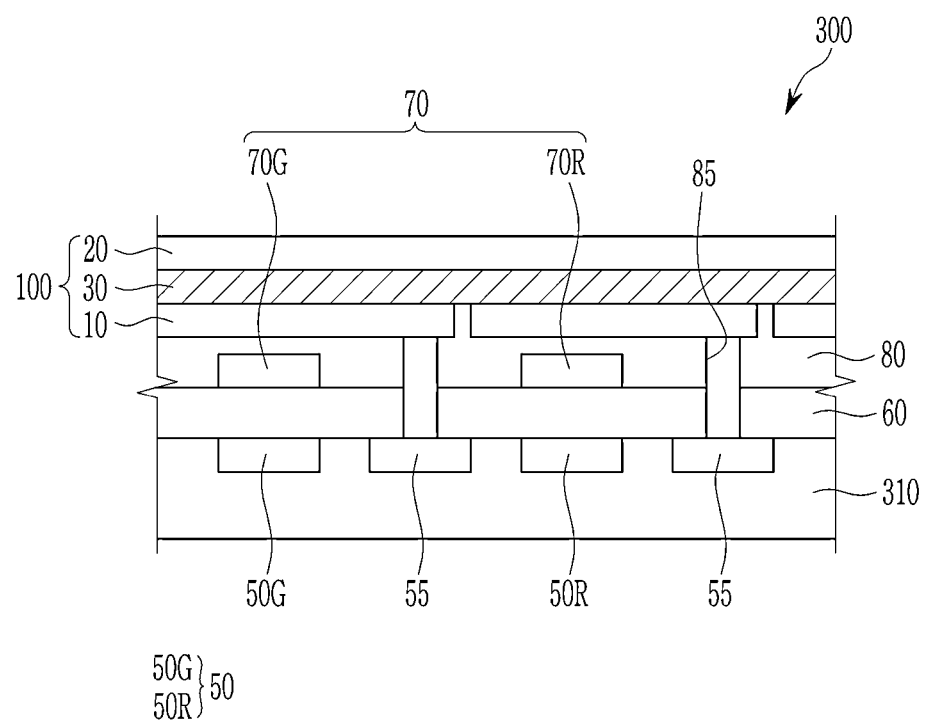
FIG. 4 is a cross-sectional view showing the organic CMOS image sensor of FIG. 3.

FIG. 3 is a schematic top plan view showing an organic CMOS image sensor according to some example embodiments, and FIG. 4 is a cross-sectional view showing the organic CMOS image sensor of FIG. 3.

Referring to FIGS. 3 and 4, an organic CMOS image sensor 300 according to some example embodiments includes a semiconductor substrate 310 integrated with photo-sensing device 50, which may include photo-sensing devices 50G and 50R, a transmission transistor (not shown), a charge storage 55, a lower insulating layer 60, a color filter layer 70, an upper insulating layer 80, and a photoelectric device 100.

The semiconductor substrate 310 may be a silicon substrate, and is integrated with the photo-sensing device 50, the transmission transistor (not shown), and the charge storage 55. The photo-sensing devices 50G and 50R may be photodiodes.

The photo-sensing devices 50G and 50R, the transmission transistor, and/or the charge storage 55 may be integrated in each pixel, and as shown in the drawing, the photo-sensing devices 50G and 50R may be respectively included in a green pixel and a red pixel and the charge storage 55 may be included in a blue pixel.

The photo-sensing devices 50G and 50R sense light, the information sensed by the photo-sensing devices may be transferred by the transmission transistor, the charge storage 55 is electrically connected to the photoelectric device 100, and the information of the charge storage 55 may be transferred by the transmission transistor.

In the drawings, the photo-sensing devices 50G and 50R are, for example, arranged in parallel without limitation, and the green photo-sensing device 50G and the red photo-sensing device 50R may be stacked in a vertical direction.

A metal wire (not shown) and a pad (not shown) are formed on the semiconductor substrate 310. In order to decrease signal delay, the metal wire and pad may be made of a metal having low resistivity, for example, aluminum (Al), copper (Cu), silver (Ag), and alloys thereof, but are not limited thereto. Further, it is not limited to the structure, and the metal wire and pad may be positioned under the photo-sensing devices 50G and 50R.

The lower insulating layer 60 is formed on the metal wire and the pad. The lower insulating layer 60 may be made of an inorganic insulating material such as a silicon oxide and/or a silicon nitride, or a low dielectric constant (low K) material such as SiC, SiCOH, SiCO, and SiOF. The lower insulating layer 60 has a trench exposing the charge storage 55. The trench may be filled with fillers.

A color filter layer 70 is formed on the lower insulating layer 60. The color filter layer 70 includes a green filter 70G formed in the green pixel and selectively transmitting green light and a red filter 70R formed in the red pixel and selectively transmitting red light. In some example embodiments, a cyan filter and a yellow filter may be disposed instead of the green filter 70G and red filter 70R. In some example embodiments, including the example embodiments shown in FIGS. 3 and 4, a blue filter is not included, but a blue filter may be further included.

The color filter layer 70 may be omitted. For example, when the green photo-sensing device 50G and the red photo-sensing device 50R are stacked in a vertical direction, the green photo-sensing device 50G and the red photo-sensing device 50R may selectively absorb light in each wavelength region depending on their stack depth, and the color filter layer 70 may not be equipped.

The upper insulating layer 80 is formed on the color filter layer 70. The upper insulating layer 80 eliminates a step caused by the color filter layer 70 and smoothens the surface. The upper insulating layer 80 and the lower insulating layer 60 may include a contact hole (not shown) exposing a pad, and a through-hole 85 exposing the charge storage 55 of the blue pixel.

The aforementioned photoelectric device 100 is formed on the upper insulating layer 80. The photoelectric device 100 includes the first electrode 10, the active layer 30, and the second electrode 20 as described above.

The first electrode 10 and the second electrode 20 may be transparent electrodes, and the active layer 30 is the same as described above. The active layer 30 selectively absorbs and/or senses light in a blue wavelength region and replaces a color filter of a blue pixel.

When light enters from the second electrode 20, the light in a blue wavelength region may be mainly absorbed in the active layer 30 and photoelectrically converted, while the light in the rest of the wavelength regions passes through first electrode 10 and may be sensed in the photo-sensing devices 50G and 50R.

As described above, the photoelectric devices configured to selectively absorb light in a blue wavelength region are stacked and thereby a size of an image sensor may be decreased and a down-sized image sensor may be realized.

As described above, the compound represented by the Chemical Formula 1 may be used as a p-type or n-type semiconductor compound, aggregation between compounds in a thin film state is inhibited, and thereby light absorption characteristics depending on a wavelength may be maintained. Thereby, blue wavelength selectivity may be maintained, crosstalk caused by unnecessary absorption of other light except a blue wavelength region may be decreased and sensitivity may be increased.

In some example embodiments, in FIG. 4, additional color filters may be further disposed on the photoelectric device 100. The additional color filters may include a green filter 70G and a red filter 70R or a cyan filter and a yellow filter.

Figure 5:
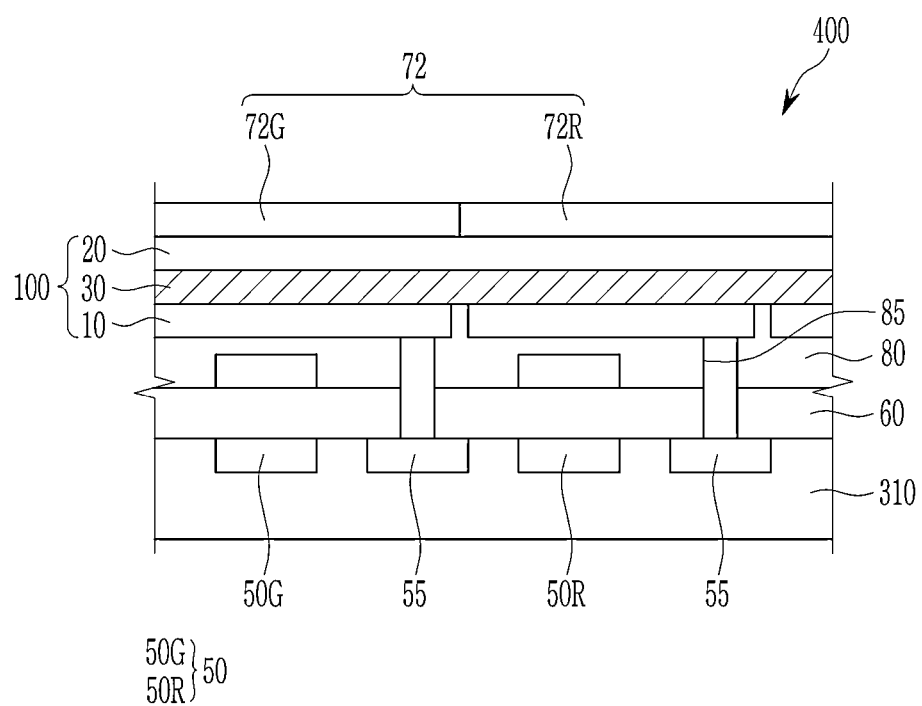
FIG. 5 is a schematic cross-sectional view showing an organic CMOS image sensor according to some example embodiments.

The organic CMOS image sensor with the color filters disposed on the photoelectric device is shown in FIG. 5. FIG. 5 is a schematic cross-sectional view showing an organic CMOS image sensor according to some example embodiments. Referring to FIG. 5, an organic CMOS image sensor 400 has the same structure as FIG. 4 except that a color filter layer 72 including the green filter 72G and the red filter 72R is disposed on the photoelectric device 100. Instead of the green filter 72G and the red filter 72R, a cyan filter and a yellow filter may be disposed respectively.

Figure 6:
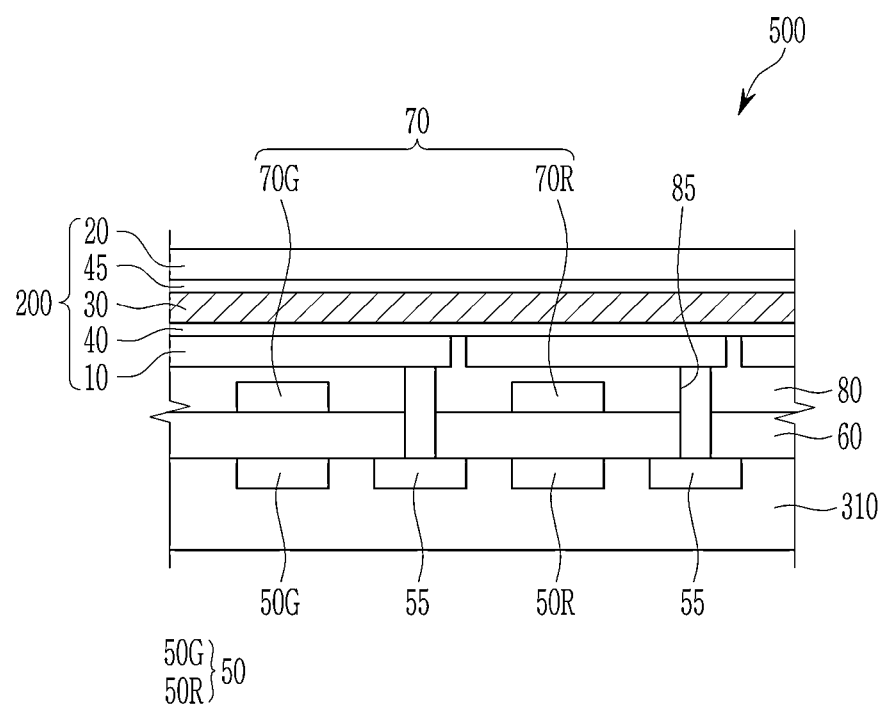
FIG. 6 is a schematic cross-sectional view showing an organic CMOS image sensor according to some example embodiments.

In FIGS. 4 and 5, the photoelectric device 100 of FIG. 1 is included, but it is not limited thereto, and thus the photoelectric device 200 of FIG. 2 may be applied in the same manner. FIG. 6 is a cross-sectional view showing an organic CMOS image sensor 500 to which the photoelectric device 200 is applied.

Referring to FIG. 6, the organic CMOS image sensor 500 includes a semiconductor substrate 310 integrated with photo-sensing devices 50G and 50R, a transmission transistor (not shown), a charge storage 55, an insulating layer 80, and a photoelectric device 200, like some example embodiments, including the example embodiments shown in FIG. 4.

However, the organic CMOS image sensor 500 according to some example embodiments, including the example embodiments shown in FIG. 6, includes the photoelectric device 200, unlike some example embodiments, including the example embodiments shown in FIG. 4, which include the photoelectric device 100.

Figure 7:
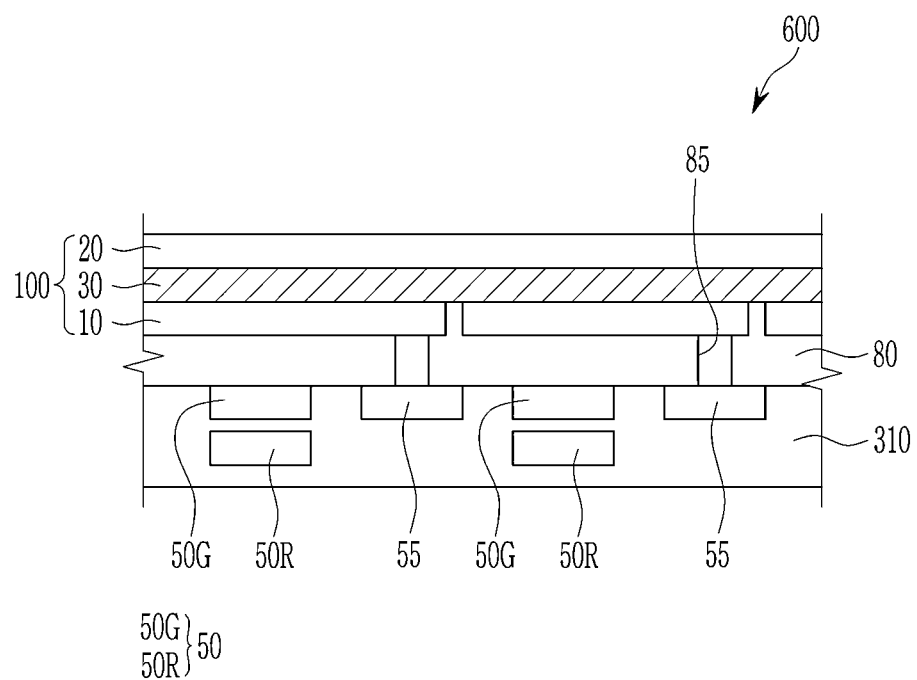
FIG. 7 is a schematic view showing an organic CMOS image sensor according to some example embodiments.

FIG. 7 is a schematic view showing an organic CMOS image sensor according to some example embodiments.

Referring to FIG. 7, the organic CMOS image sensor 600 includes a semiconductor substrate 310 integrated with photo-sensing devices 50G and 50R, a transmission transistor (not shown), a charge storage 55, an insulating layer 80, and a photoelectric device 100, like some example embodiments, including the example embodiments shown in FIG. 5.

However, the organic CMOS image sensor 600 according to some example embodiments, including the example embodiments shown in FIG. 7 includes the green photo-sensing device 50G and the red photo-sensing device 50R that are stacked and does not include a color filter layer 70, unlike some example embodiments, including the example embodiments shown in FIG. 5. The green photo-sensing device 50G and the red photo-sensing device 50R are electrically connected with the charge storage 55, and the information of the charge storage 55 may be transferred by the transmission transistor (not shown). The green photo-sensing device 50G and the red photo-sensing device 50R may selectively absorb light in each wavelength region depending on a stack depth.

As described above, the photoelectric devices configured to selectively absorb light in a blue wavelength region are stacked and the red photo-sensing device and the green photo-sensing device are stacked, and thereby a size of an image sensor may be decreased and a down-sized image sensor may be realized. As described above, the photoelectric device 100 has improved blue wavelength selectivity, and crosstalk caused by unnecessary absorption light in a wavelength region except blue may be decreased while increasing sensitivity.

In FIG. 7, the photoelectric device 100 of FIG. 1 is included, but it is not limited thereto, and thus the photoelectric device 200 of FIG. 2 may be applied in the same manner.

Figure 8:
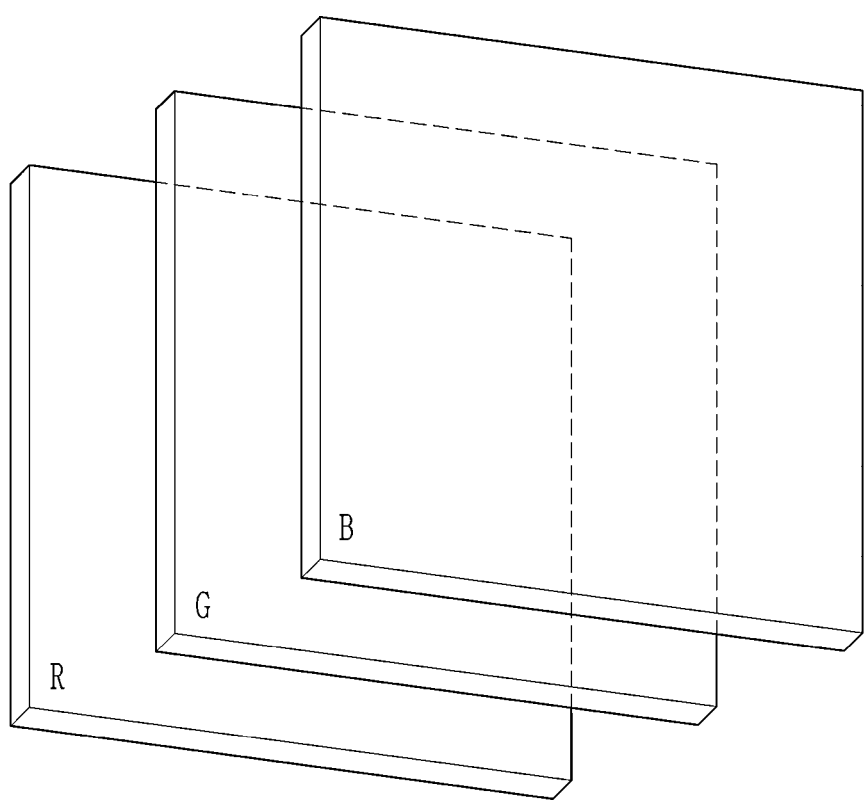
FIG. 8 is a plan view schematically illustrating an organic CMOS image sensor according to some example embodiments.
Figure 9:
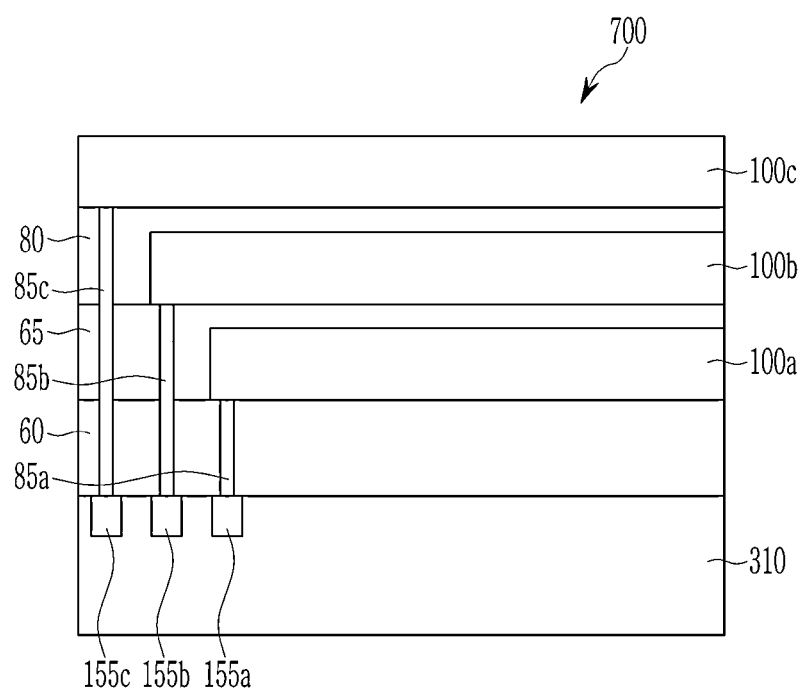
FIG. 9 is a cross-sectional view of the organic CMOS image sensor of FIG. 8.

FIG. 8 is a plan view schematically illustrating an organic CMOS image sensor according to some example embodiments and FIG. 9 is a cross-sectional view of the organic CMOS image sensor of FIG. 8

Referring to FIGS. 8 and 9, the organic CMOS image sensor 700 according to some example embodiments, including the example embodiments shown in FIG. 8 includes a red photoelectric device (R) configured to selectively absorb light in a red wavelength region, a green photoelectric device (G) configured to selectively absorb light in a green wavelength region, and a blue photoelectric device (B) configured to selectively absorb light in a blue wavelength region that are stacked.

The image sensor 700 according to some example embodiments, including the example embodiments shown in FIG. 8 includes a semiconductor substrate 310, a lower insulating layer 60, an intermediate insulating layer 65, an upper insulating layer 80, a first device 100a, and a second device 100b, and the third device 100c.

The semiconductor substrate 310 may be a silicon substrate, and a transmission transistor (not shown) and charge storages 155a, 155b, and 155c are integrated therein.

Metal wires (not shown) and pads (not shown) are formed on the semiconductor substrate 310, and the lower insulating layer 60 is formed on the metal wires and the pads.

The first device 100a, the second device 100b, and the third device 100c are sequentially formed on the lower insulating layer 60.

The first, second, and third devices 100a, 100b, and 100c may each independently be the photoelectric devices 100 and 200 of FIG. 1 or 2. Detailed descriptions of the photoelectric devices 100 and 200 are the same as described above. The first electrode 10 and the second electrode 20 of the photoelectric devices 100 and 200 may be connected to the charge storages 155a, 155b, and 155c.

The active layer 30 of the first device 100a may be a photoelectric conversion device that selectively absorbs light in any one wavelength region of red, blue, or green to photoelectrically convert the light. For example, the first device 100a may be a red photoelectric conversion device. The first electrode 10 and the second electrode 20 of the first device 100a may be electrically connected to the first charge storage 155a.

The intermediate insulating layer 65 may be formed on the first device 100a and the second device 100b may be formed on the intermediate insulating layer 65.

The active layer 30 of the second device 100b may be a photoelectric conversion device that selectively absorbs light in any one wavelength region of red, blue, or green to photoelectrically convert the light. For example, the second device 100b may be a green photoelectric conversion device. The first electrode 10 and the second electrode 20 of the second device 100b may be electrically connected to the second charge storage 155b.

The upper insulating layer 80 is formed on the second device 100b. The lower insulating layer 60, the intermediate insulating layer 65, and the upper insulating layer 80 have a plurality of through-holes 85a, 85b, and 85c exposing the charge storages 155a, 155b, and 155c.

The third device 100c is formed on the upper insulating layer 80. The active layer 30 of the third device 100c may be a photoelectric conversion device that selectively absorbs light in any one wavelength region of red, blue, or green to photoelectrically convert the light. For example, the third device 100c may be a blue photoelectric conversion device. The first electrode 10 and the second electrode 20 of the third device 100c may be electrically connected to the third charge storage 155c.

A focusing lens (not shown) may be further formed on the third device 100c. The focusing lens may control direction of incident light and gather the light in one region. The focusing lens may have a shape of, for example, a cylinder or a hemisphere, but is not limited thereto.

In the drawing, a structure in which the first device 100a, the second device 100b, and the third device 100c are sequentially stacked, but is not limited thereto, and the stacking order may be variously changed.

As described above, the first device 100a, the second device 100b, and the third device 100c that absorb light in different wavelength regions have a stacked structure, further reducing a size of the image sensor, implementing a down-sized image sensor, and simultaneously increasing sensitivity and reducing a crosstalk.

The image sensor may be applied to various electronic devices, for example, a mobile phone, a digital camera, and the like but is not limited thereto.

Figure 10:
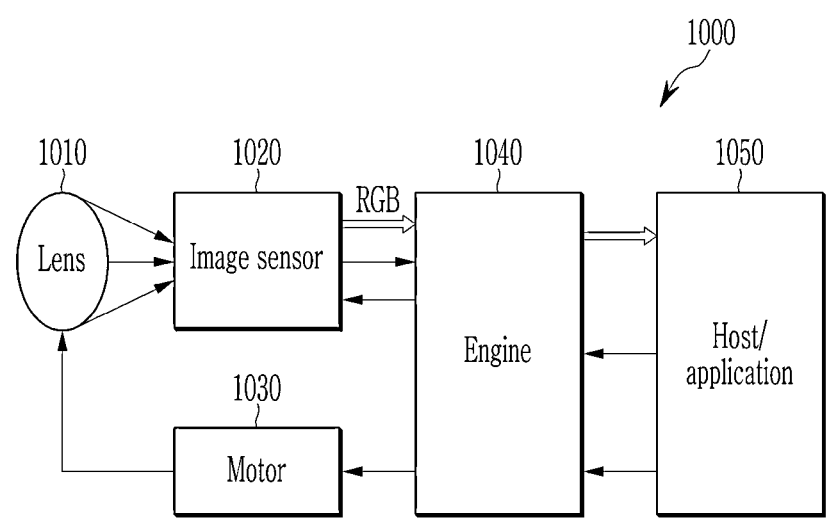
FIG. 10 is a block diagram of a digital camera including an image sensor according to some example embodiments.

FIG. 10 is a block diagram of a digital camera including an image sensor according to some example embodiments.

Referring to FIG. 10, a digital camera 1000 includes a lens 1010, an image sensor 1020, a motor 1030, and an engine 1040. The image sensor 1020 may be any one of the image sensors according to any of the example embodiments, including any of the example embodiments shown in FIGS. 3 to 9.

The lens 1010 concentrates incident light on the image sensor 1020. The image sensor 1020 generates RGB data for received light through the lens 1010.

In some example embodiments, the image sensor 1020 may interface with the engine 1040.

The motor 1030 may adjust the focus of the lens 1010 or perform shuttering in response to a control signal received from the engine 1040. The engine 1040 may control the image sensor 1020 and the motor 1030.

The engine 1040 may be connected to a host/application 1050.

Figure 11:
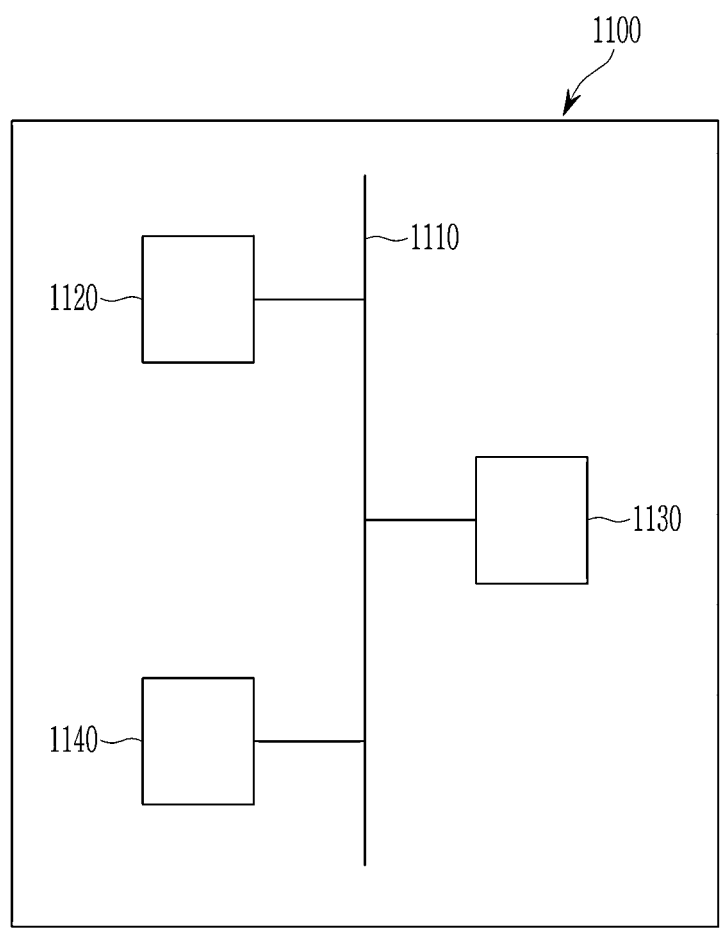
FIG. 11 is a schematic diagram of an electronic device according to some example embodiments.

FIG. 11 is a schematic diagram showing an electronic device according to some example embodiments.

Referring to FIG. 11, an electronic device 1100 may include a processor 1120, a memory 1130, and an image sensor 1140 that are electrically coupled together via a bus 1110.

The image sensor 1140 may be any one of the image sensors according to any of the example embodiments, including any of the example embodiments shown in FIGS. 3 to 9. The memory 1130, which may be a non-transitory computer readable medium and may store a program of instructions. The memory 1130 may be a nonvolatile memory, such as a flash memory, a phase-change random access memory (PRAM), a magneto-resistive RAM (MRAM), a resistive RAM (ReRAM), or a ferro-electric RAM (FRAM), or a volatile memory, such as a static RAM (SRAM), a dynamic RAM (DRAM), or a synchronous DRAM (SDRAM). The processor 1120 may execute the stored program of instructions to perform one or more functions. For example, the processor 1120 may be configured to process electrical signals generated by the image sensor 1140. The processor 1120 may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processor 1120 may be configured to generate an output (e.g., an image to be displayed on a display interface) based on such processing.

One or more of the processor 1120, memory 1130, motor 1030, engine 1040, or host/application 1050 may be included in, include, and/or implement one or more instances of processing circuitry such as hardware including logic circuits, a hardware/software combination such as a processor executing software; or a combination thereof. In some example embodiments, said one or more instances of processing circuitry may include, but are not limited to, a central processing unit (CPU), an application processor (AP), an arithmetic logic unit (ALU), a graphic processing unit (GPU), a digital signal processor, a microcomputer, a field programmable gate array (FPGA), a System-on-Chip (SoC) a programmable logic unit, a microprocessor, or an application-specific integrated circuit (ASIC), etc. In some example embodiments, any of the memories, memory units, or the like as described herein may include a non-transitory computer readable storage device, for example a solid state drive (SSD), storing a program of instructions, and the one or more instances of processing circuitry may be configured to execute the program of instructions to implement the functionality of some or all of any of the processor 1120, memory 1130, motor 1030, engine 1040, or host/application 1050, or the like according to any of the example embodiments as described herein.

Hereinafter, some example embodiments are illustrated in more detail with reference to examples. However, these examples are non-limiting, and inventive concepts are not limited thereto.

Synthesis Example 1: Synthesis of Compound Represented by Chemical

Formula 1A

[Chemical Formula 1A]

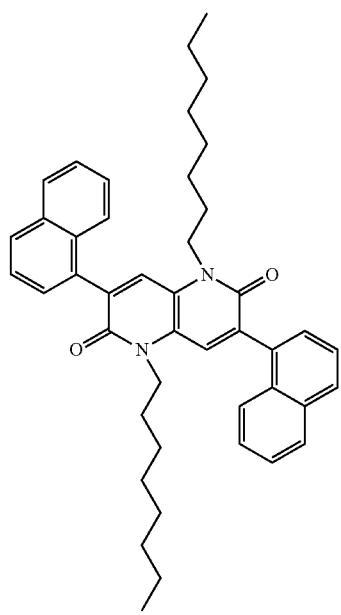

[Reaction Scheme 1A]

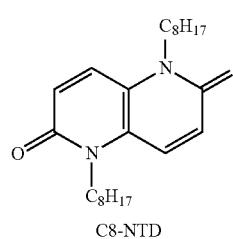

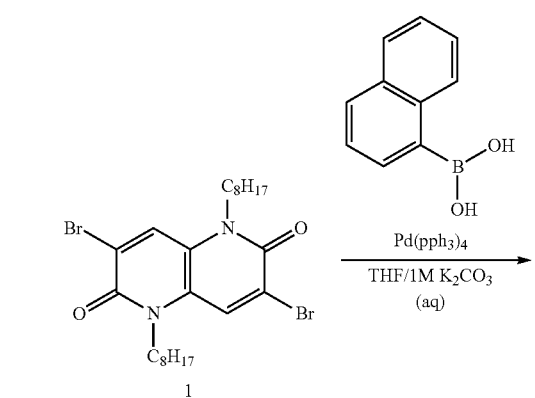

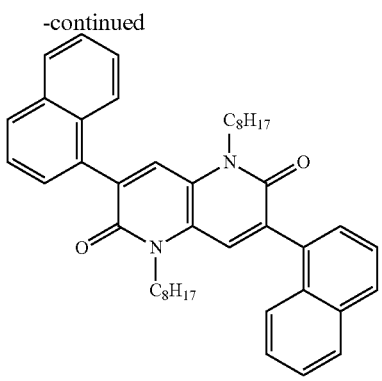

1A (i) Synthesis of Compound 1 (3,7-dibromo-1,5-dioctyl-1,5-naphthyridine-2,6-dione 1.55 g (4.0 mmol) of C8-NTD is dissolved in 60 ml of acetic acid and stirred at 0° C. to prepare a first solution. N-bromosuccin imide 2.0 g (11.2 mmol) of N-bromosuccinimide is added to the first solution and stirred at 90° C. for one day to prepare a second solution. After the temperature is lowered to room temperature, the second solution is poured into water, and then the organic material is extracted from $CHCl_3$. At this time, the obtained product is separated and purified through silica gel column chromatography (methylene chloride:methanol, volume ratio of 99:1) to obtain Compound 1 (1.91 g, Yield: 87.8%).

$^1$H NMR (300 MHz, CDCl3) δ[ppm]: 7.95 (s, 2H), 4.26 (t, J=8.4 Hz, 4H), 1.72 (m, 4H), 1.49-1.21 (m, 20H), 0.89 (t, J=6.9 Hz, 6H).

(ii) Synthesis of Compound 1A (3,7-di(naphthalen-1-yl)-1,5-dioctyl-1,5-naphthyridine-2,6-dione Compound 1 (0.2 g, 0.37 mmol), 1-naphthaleneboronic acid, 0.19 g, 1.10 mmol), and tetrakis(triphenyl phosphine) palladium (0) (0.042 g, 0.037 mmol) are dissolved in tetrahydrofuran (THF, 24 ml) and purged with argon to prepare a first solution. A 1M $K_2CO_3$ aqueous solution (6 ml) is added to the first solution and stirred at 70° C. for one day. After the temperature is lowered to room temperature, the first solution is poured into water, and then the organic material is extracted from $CHCl_3$. At this time, the obtained product is separated and purified through silica gel column chromatography (ethyl acetate:n-hexane, volume ratio of 1:5) to obtain the compound represented by Chemical Formula 1A (0.13 g, Yield: 54.0%).

$^1$H NMR (300 MHz, $CDCl_3$) δ[ppm]: 7.99-7.90 (m, 4H), 7.80-7.73 (m, 4H), 7.63-7.44 (m, 8H), 4.33 (s, 4H), 1.87-1.72 (m, 4H), 1.48-1.10 (m, 20H), 0.82 (t, J=6.7 Hz, 6H).

$^{13}$C NMR (126 MHz, $CDCl_3$) δ[ppm]: 158.97, 135.58, 134.76, 133.95, 133.95, 131.82, 129.45, 128.80, 128.28, 127.86, 126.71, 126.28, 126.24, 125.62, 125.58, 44.02, 31.90, 29.41, 29.34, 28.97, 27.08, 22.78, 14.26; HR MS (FAB+, m-NBA): calcd for C44H50N2O2 ([M+H]+), 639.3872; found, 639.3953; EA Anal. calcd for C44H50N2O2: C, 82.72; H, 7.89; N, 4.38; O, 5.01; found: C, 82.75; H, 7.64; N, 4.32; O, 5.19.

Synthesis Example 2: Synthesis of Compound Represented by Chemical Formula 1B

[Chemical Formula 1B]

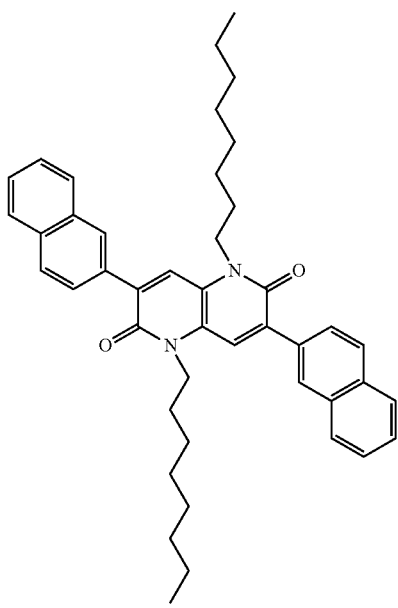

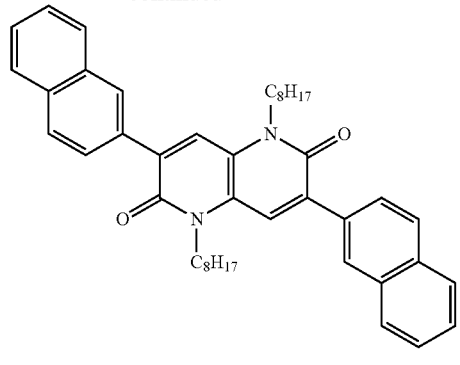

1B

In the final step of Synthesis Example 2, the compound represented by Chemical Formula 1B (0.13 g, Yield: 54%) was prepared in the same manner as in Synthesis Example 1 except that 2-naphthaleneboronic acid is used instead of 1-naphthaleneboronic acid.

$^1$H NMR (300 MHz, CDCl3) δ[ppm]: 8.31 (s, 2H), 7.98-7.91 (m, 4H), 7.91-7.83 (m, 4H), 7.82 (s, 2H), 7.58-7.48 (m, 4H), 4.43 (t, J=8.6 Hz, 4H), 1.92-1.79 (m, 4H), 1.58-1.19 (m, 20H), 0.85 (t, J=6.7 Hz, 3H). $^{13}$C NMR (126 MHz, CDCl3) δ[ppm]: 158.97, 135.58, 134.76, 133.95, 133.95, 131.82, 129.45, 128.80, 128.28, 127.86, 126.71, 126.28, 126.24, 125.62, 125.58, 44.02, 31.90, 29.41, 29.34, 28.97, 27.08, 22.78, 14.26; HR MS (FAB+, m-NBA): calcd for 044H50N2O2 ([M+H]+), 639.3872; found, 639.3952; EA Anal. calcd for C44H50N2O2: C, 82.72; H, 7.89; N, 4.38; O, 5.01; found: C, 82.69; H, 7.85; N, 4.32; O, 5.22.

Evaluation 1: Energy Level of Compounds

The HOMO and LUMO energy levels of the compounds according to Synthesis Example 1 and Synthesis Example 2 are measured by cyclic voltammetry.

[Reaction Scheme 1B]

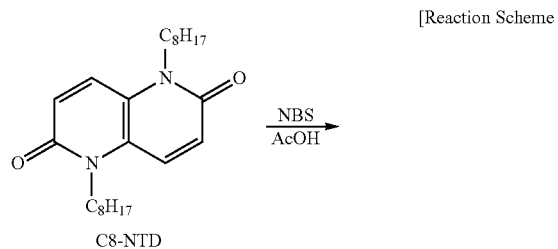

C8-NTD

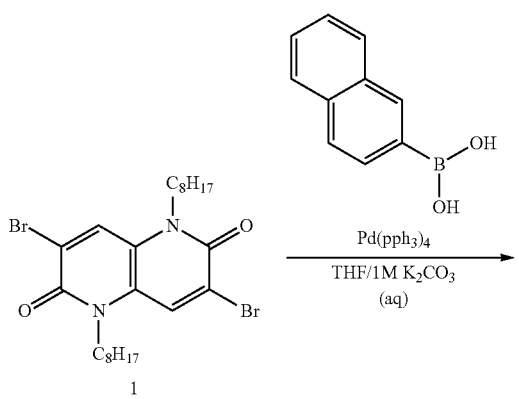

1

The compounds according to Synthesis Example 1 and Synthesis Example 2 are deposited to a thickness of 100 nm on ITO-coated glass at a rate of 0.5 to 1.0 Å/s under high vacuum (<10$^{-7}$ Torr) with C60 at a volume ratio of 1:1, respectively, to manufacture each electrode.

A Princeton Applied Research Potentiostat/Galvanostat Model 273A is placed over a tri-electrode cell assembly containing a working electrode of the above electrode, a counter electrode of platinum wire, and a reference electrode of a silver wire, electricity is applied to the electrodes in a CH$_2$Cl$_2$/0.1 M Bu$_4$NBF$_4$ solution, and an oxidation-reduction voltage is measured. The HOMO energy level is estimated based on the onset oxidation potential ($E_{ox}$), and $E_{ox}$ is calibrated using ferrocene ($E_{Fc/Fc+}$). The results are shown in Table 1.

TABLE 1

|  | Compound | HOMO (eV) | LUMO (eV) | Bandgap energy (eV) |
|---|---|---|---|---|
| Synthesis Example 1 | Chemical Formula 1A | −5.62 | −2.29 | 3.33 |
| Synthesis Example 2 | Chemical Formula 1B | −5.56 | −2.40 | 3.16 |

Referring to Table 1, the compounds according to Synthesis Example 1 and Synthesis Example 2 exhibit excellent selective absorption characteristics of the blue wavelength because the maximum absorption wavelengths are located in the blue region and the full widths at half maximum (FWHMs) thereof are also narrow. In addition, it is confirmed that the compounds may be used as a p-type semiconductor from HOMO, LUMO, and bandgap energies.

Evaluation 2: Thermal Stability of Compounds

The thermal stability of the compounds according to Synthesis Example 1 and Synthesis Example 2 is evaluated by measuring the decomposition temperature (Td) at the time when their weights are reduced by 10 wt % of the total weight using a thermogravimetric analyzer TGA Q5000 (manufactured by TA instruments) (heating rate: 10° C./min).

Figure 12:
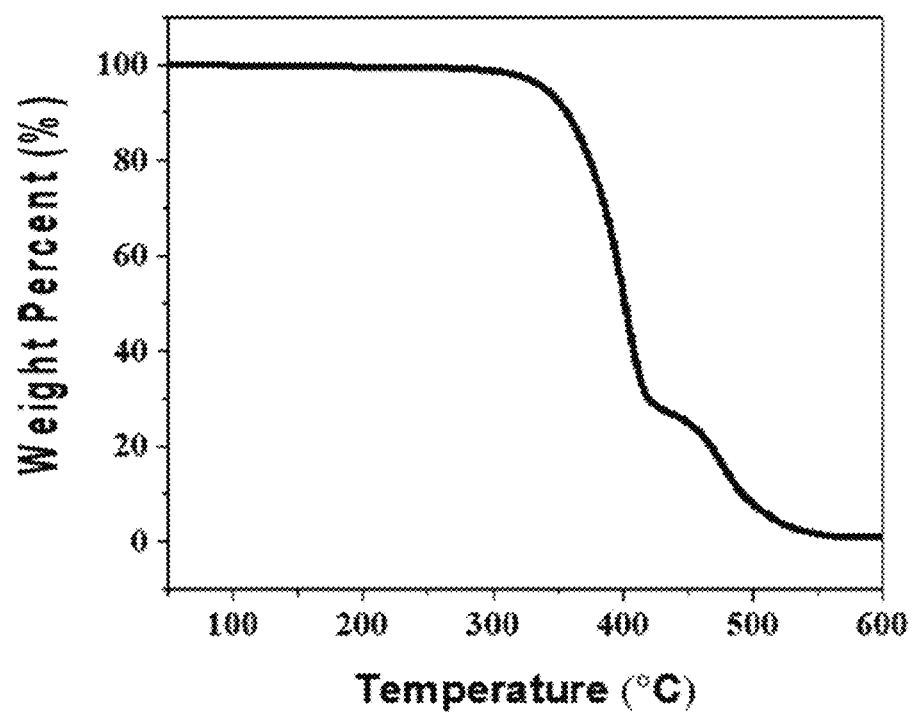
FIGS. 12 and 13 show thermogravimetric analysis results of compounds according to Synthesis Example 1 and Synthesis Example 2, respectively.
Figure 13:
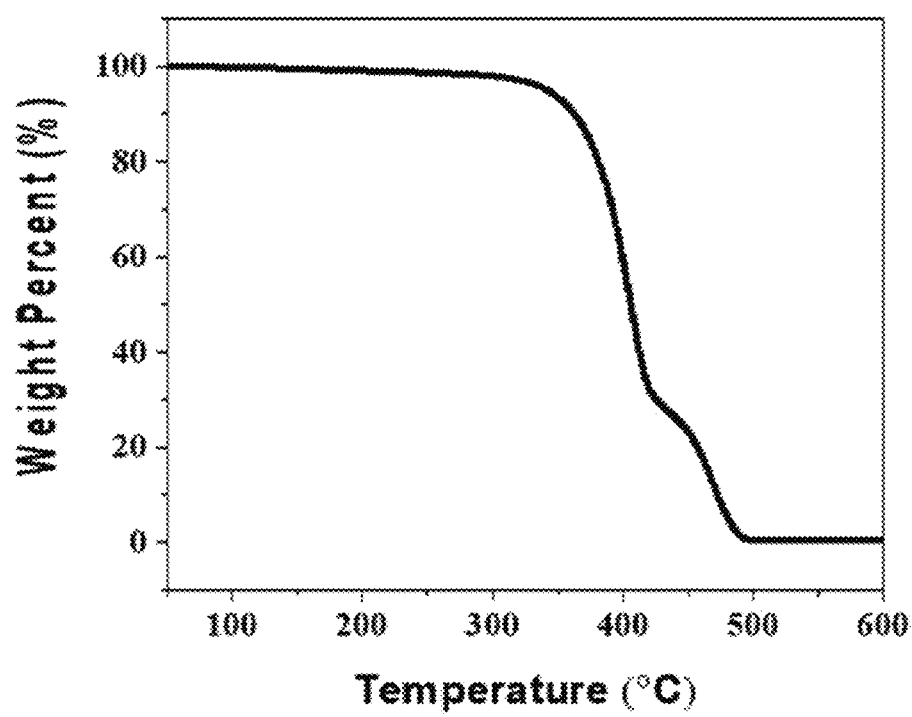

The results are shown in FIGS. 12 and 13. FIGS. 12 and 13 show thermogravimetric analysis results of compounds according to Synthesis Example 1 and Synthesis Example 2, respectively. Referring to FIGS. 12 and 13, the decomposition temperature of the compound according to Synthesis Example 1 is 334° C., and the decomposition temperature of the compound according to Synthesis Example 2 is 342° C.

Example 1: Manufacture of Photoelectric Device

An about 150 nm-thick anode is formed by sputtering ITO on a glass substrate, and a 140 nm-thick active layer is formed thereon by codepositing a compound represented by Chemical Formula 1A according to Synthesis Example 1 (p-type semiconductor compound) and C60 (n-type semiconductor compound) in a volume ratio of 1:1. Subsequently, a 10 nm-thick molybdenum oxide ($MoO_x$, $0<x\leq 3$) thin film is formed thereon as a charge auxiliary layer. On the molybdenum oxide thin film, a 7 nm-thick cathode is formed by sputtering ITO, manufacturing an organic photoelectric device.

Example 2: Manufacture of Photoelectric Device

Photoelectric devices according to Example 2 is manufactured according to the same method as Example 1 except that the compound of Synthesis Example 2 is used instead of the compound according to Synthesis Example 1.

Evaluation 3: Light Absorption Characteristics of Photoelectric Device

The photoelectric devices according to Examples 1 and 2 are irradiated with ultraviolet-visible light (UV-Vis) using Cary 5000 UV spectroscopy (manufactured by Varian) to evaluate absorption characteristics (maximum absorption wavelength, full width at half maximum (FWHM)). The results are shown in Table 2. For comparison, the maximum absorption wavelength and full width at half maximum (FWHM) of a commercially available color filter are also shown in Table 2.

TABLE 2

| | Compound | $\lambda_{max}$ (nm) | Full width at half maximum (FWHM) (nm) |
|---|---|---|---|
| Example 1 | Chemical Formula 1A | 440 | 70.7 |
| Example 2 | Chemical Formula 1B | 460 | 80.5 |
| Comparative Example | Color Filter | 460 | 130 |

Referring to Table 2, in the photoelectric devices according to Examples 1 and 2, including the compounds according to Synthesis Example 1 and Synthesis Example 2, the maximum absorption wavelengths are located in the blue region and full widths at half maximum (FWHM) are narrow, compared with a commercially available color filter (comparative example), which shows their blue wavelength selective absorption characteristics are improved.

While the inventive concepts have been described in connection with what is presently considered to be practical example embodiments, it is to be understood that the inventive concepts are not limited to such example embodiments. On the contrary, the inventive concepts are intended to cover various modifications and equivalent arrangements included within the spirit and scope of the appended claims.

<Description of symbols>

| | |
|---|---|
| 10: first electrode | 20: second electrode |
| 30: active layer | 40, 45: charge auxiliary layer |
| 100, 200: photoelectric device | |
| 300, 400, 500, 600, 700: organic CMOS image sensor | |
| 310: semiconductor substrate | 70G: green filter |
| 70R: red filter | |
| 70: color filter layer | 85: through-hole |
| 60: lower insulating layer | 80: upper insulating layer |
| 50G, 50R: photo-sensing device | 55: charge storage |

What is claimed is:

1. A blue light absorbing film comprising a compound represented by Chemical Formula 1 and configured to selectively absorb light in a blue wavelength region:

[Chemical Formula 1]

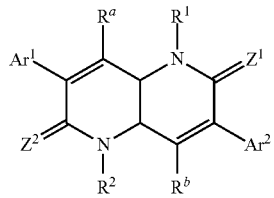

wherein, in Chemical Formula 1,
$Ar^1$ and $Ar^2$ are each independently a substituted or unsubstituted C5 to C30 aromatic hydrocarbon group or a substituted or unsubstituted C3 to C30 hetero aromatic hydrocarbon group,
$Z^1$ and $Z^2$ are each independently O, S, Se, Te, or C(CN) 2,
$R^1$ and $R^2$ are each independently a substituted or unsubstituted C6 to C40 alkyl group, a substituted or unsubstituted C3 to C30 cycloalkyl group, a substituted or unsubstituted C3 to C30 heterocycloalkyl group, a substituted or unsubstituted C6 to C30 aryl group, or a substituted or unsubstituted C3 to C30 heteroaryl group, and
$R^a$ and $R^b$ are each independently hydrogen, deuterium, a halogen, a cyano group, or a C1 to C10 alkyl group.

2. The blue light absorbing film of claim 1, wherein, in Chemical Formula 1, the substituted or unsubstituted C5 to C30 aromatic hydrocarbon group is a substituted or unsubstituted phenyl group, a substituted or unsubstituted naphthyl group, a substituted or unsubstituted anthracenyl group, a substituted or unsubstituted phenanthrenyl group, a substituted or unsubstituted naphthacenyl group, a substituted or unsubstituted pyrenyl group, a substituted or unsubstituted biphenyl group, a substituted or unsubstituted p-terphenyl group, a substituted or unsubstituted m-terphenyl group, a substituted or unsubstituted o-terphenyl group, a substituted or unsubstituted chrysenyl group, a substituted or unsubstituted triphenylenyl group, a substituted or unsubstituted perylenyl group, a substituted or unsubstituted fluorenyl group, or a substituted or unsubstituted indenyl group.

3. The blue light absorbing film of claim 1, wherein, in Chemical Formula 1, the substituted or unsubstituted C3 to C30 hetero aromatic hydrocarbon group is a substituted or unsubstituted furanyl group, a substituted or unsubstituted thienyl group, a substituted or unsubstituted selenophenyl group, a substituted or unsubstituted pyrrolyl group, a substituted or unsubstituted pyrazolyl group, a substituted or unsubstituted imidazolyl group, a substituted or unsubstituted triazolyl group, a substituted or unsubstituted oxazolyl group, a substituted or unsubstituted isoxazolyl group, a substituted or unsubstituted thiazolyl group, a substituted or unsubstituted isothiazolyl group, a substituted or unsubstituted oxadiazolyl group, a substituted or unsubstituted thiadiazolyl group, a substituted or unsubstituted pyridyl group, a substituted or unsubstituted pyridinyl group, a substituted or unsubstituted pyrimidinyl group, a substituted or unsubstituted pyrazinyl group, a substituted or unsubstituted triazinyl group, a substituted or unsubstituted benzofuranyl group, a substituted or unsubstituted benzothiophenyl group, a substituted or unsubstituted benzimidazolyl group, a substituted or unsubstituted indolyl group, a substituted or unsubstituted quinolinyl group, a substituted or unsubstituted isoquinolinyl group, a substituted or unsubstituted quinazolinyl group, a substituted or unsubstituted phthalazinyl group, a substituted or unsubstituted quinoxalinyl group, a substituted or unsubstituted naphthyridinyl group, a substituted or unsubstituted cinnolinyl group, a substituted or unsubstituted benzoxazinyl group, a substituted or unsubstituted benzthiazinyl group, a substituted or unsubstituted acridinyl group, a substituted or unsubstituted phenazinyl group, a substituted or unsubstituted phenothiazinyl group, a substituted or unsubstituted phenoxazinyl group, a substituted or unsubstituted dibenzofuranyl group, a substituted or unsubstituted dibenzothiophenyl group, a substituted or unsubstituted benzotriazinyl group, a substituted or unsubstituted pyridopyrazinyl group, a substituted or unsubstituted pyridopyrimidinyl, a substituted or unsubstituted pyridopyridazinyl group, a substituted or unsubstituted benzothienyl group, or a substituted or unsubstituted benzoselenophenyl group.

4. The blue light absorbing film of claim 1, wherein, in Chemical Formula 1, the substituted or unsubstituted C5 to C30 aromatic hydrocarbon group is one of functional groups of Chemical Formula 1-1:

[Chemical Formula 1-1]

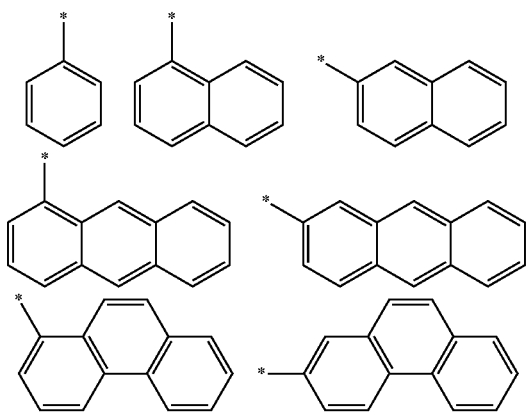

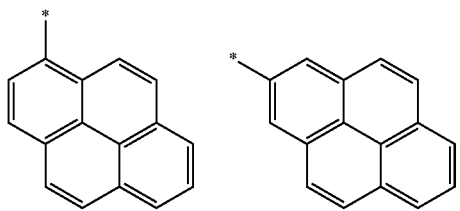

wherein, in Chemical Formula 1-1,
a hydrogen of —CH— of each aromatic ring is optionally replaced by a substituent of a substituted or unsubstituted C1 to C20 alkyl group, a substituted or unsubstituted C1 to C20 alkoxy group, a substituted or unsubstituted C6 to C10 aryl group, a substituted or unsubstituted a C4 to C10 heteroaryl group, a halogen, a cyano group, a cyano-containing group, or a combination thereof, and
* indicates a linking position.

5. The blue light absorbing film of claim 1, wherein, in Chemical Formula 1, the substituted or unsubstituted C3 to C30 hetero aromatic hydrocarbon group is one of functional groups represented by Chemical Formula 1-2:

[Chemical Formula 1-2]

(1)
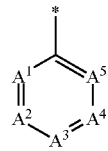

(2)
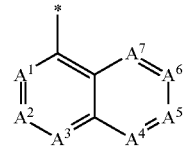

(3)
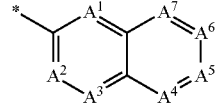

(4)
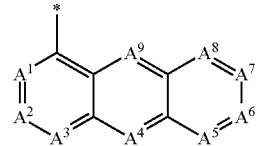

(5)
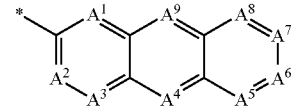

(6)
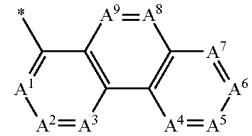

-continued

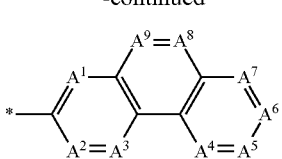
(7)

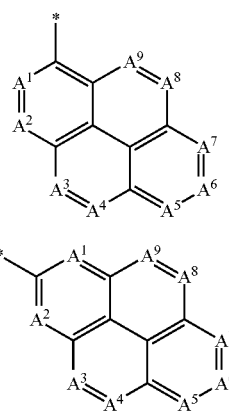
(8)

(9)

wherein, in Chemical Formula 1-2,
A¹ to A⁹ are each independently N or CR$^k$, wherein, R$^k$ is hydrogen, deuterium, a substituted or unsubstituted C1 to C20 alkyl group, a substituted or unsubstituted C1 to C20 alkoxy group, a substituted or unsubstituted C6 to C10 aryl group, a substituted or unsubstituted C4 to C10 heteroaryl group, a halogen, a cyano group, a cyano-containing group, or a combination thereof,
1 to 3 of A¹ to A⁵ of Chemical Formula (1) of Chemical Formula 1-2 are N,
1 to 3 of A¹ to A⁷ of Chemical Formulas (2) and (3) of Chemical Formula 1-2 are N,
1 to 4 of A¹ to A⁹ of Chemical Formulas (4) to (9) of Chemical Formula 1-2 are N, and
* indicates a linking position.

6. The blue light absorbing film of claim 1, wherein, in Chemical Formula 1, the substituted or unsubstituted C5 to C30 aromatic hydrocarbon group is one of functional groups represented by Chemical Formula 1-3:

[Chemical Formula 1-3]

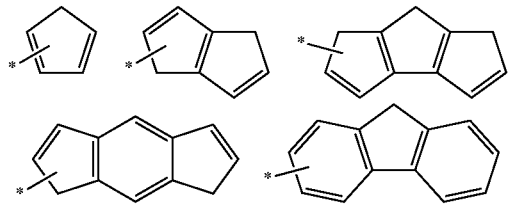

wherein, in Chemical Formula 1-3,
a hydrogen of —CH— of each aromatic ring is optionally replaced by a substituent of a substituted or unsubstituted C1 to C20 alkyl group, a substituted or unsubstituted C1 to C20 alkoxy group, a substituted or unsubstituted C6 to C10 aryl group, a substituted or unsubstituted a C4 to C10 heteroaryl group, a halogen, a cyano group, a cyano-containing group, or a combination thereof, and
* indicates a linking position.

7. The blue light absorbing film of claim 1, wherein, in Chemical Formula 1, the substituted or unsubstituted C3 to C30 hetero aromatic hydrocarbon group is one of functional groups represented by Chemical Formula 1-4:

[Chemical Formula 1-4]

(1)

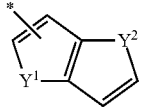
(2)

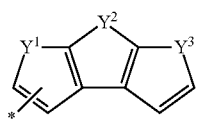
(3)

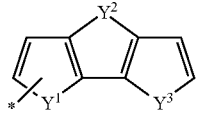
(4)

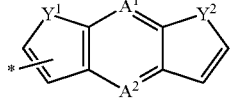
(5)

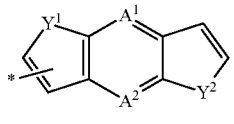
(6)

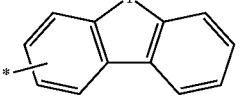
(7)

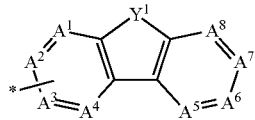
(8)

wherein, in Chemical Formula 1-4,
Y¹ to Y³ are each independently O, S, Se, Te, or NR$^a$, wherein, R$^a$ is hydrogen, deuterium, or a substituted or unsubstituted C1 to C10 alkyl group,
A¹ to A⁸ are each independently N or CR$^k$, wherein, R$^k$ is hydrogen, deuterium, a substituted or unsubstituted C1 to C20 alkyl group, a substituted or unsubstituted C1 to C20 alkoxy group, a substituted or unsubstituted C6 to C10 aryl group, a substituted or unsubstituted C4 to C10 heteroaryl group, a halogen, a cyano group, a cyano-containing group, or a combination thereof,
a hydrogen of —CH— of each aromatic ring is optionally replaced by a substituent of a substituted or unsubstituted C1 to C20 alkyl group, a substituted or unsubstituted C1 to C20 alkoxy group, a substituted or unsubstituted C6 to C10 aryl group, a substituted or unsubstituted a C4 to C10 heteroaryl group, a halogen, a cyano group, a cyano-containing group, or a combination thereof, in Chemical Formula (8) of Chemical Formula 1-4, one of $A^1$ to $A^4$ is a linking portion, and at least one of $A^1$ to $A^8$ is nitrogen (N), and

* indicates a linking position.

8. The blue light absorbing film of claim 1, wherein the blue light absorbing film is configured to exhibit an absorption curve having a full width at half maximum (FWHM) of about 50 nm to about 90 nm.

9. The blue light absorbing film of claim 1, wherein the blue light absorbing film is configured to exhibit an absorption curve having a central wavelength of less than or equal to about 460 nm.

10. A photoelectric device, comprising
a first electrode and a second electrode facing each other, and
an active layer between the first electrode and the second electrode,
wherein the active layer includes a compound represented by Chemical Formula 1:

[Chemical Formula 1]

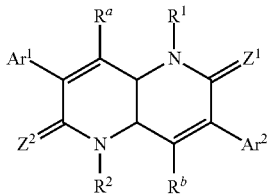

wherein, in Chemical Formula 1,
$Ar^1$ and $Ar^2$ are each independently a substituted or unsubstituted C5 to C30 aromatic hydrocarbon group or a substituted or unsubstituted C3 to C30 hetero aromatic hydrocarbon group,
$Z^1$ and $Z^2$ are each independently O, S, Se, Te, or C(CN) 2,
$R^1$ and $R^2$ are each independently a substituted or unsubstituted C6 to C40 alkyl group, a substituted or unsubstituted C3 to C30 cycloalkyl group, a substituted or unsubstituted C3 to C30 heterocycloalkyl group, a substituted or unsubstituted C6 to C30 aryl group, or a substituted or unsubstituted C3 to C30 heteroaryl group, and
$R^a$ and $R^b$ are each independently hydrogen, deuterium, a halogen, a cyano group, or a C1 to C10 alkyl group.

11. The photoelectric device of claim 10, wherein, in Chemical Formula 1, the substituted or unsubstituted C5 to C30 aromatic hydrocarbon group is a substituted or unsubstituted phenyl group, a substituted or unsubstituted naphthyl group, a substituted or unsubstituted anthracenyl group, a substituted or unsubstituted phenanthrenyl group, a substituted or unsubstituted naphthacenyl group, a substituted or unsubstituted pyrenyl group, a substituted or unsubstituted biphenyl group, a substituted or unsubstituted p-terphenyl group, a substituted or unsubstituted m-terphenyl group, a substituted or unsubstituted o-terphenyl group, a substituted or unsubstituted chrysenyl group, a substituted or unsubstituted triphenylenyl group, a substituted or unsubstituted perylenyl group, a substituted or unsubstituted fluorenyl group, or a substituted or unsubstituted indenyl group.

12. The photoelectric device of claim 10, wherein, in Chemical Formula 1, the substituted or unsubstituted C3 to C30 hetero aromatic hydrocarbon group is a substituted or unsubstituted furanyl group, a substituted or unsubstituted thienyl group, a substituted or unsubstituted selenophenyl group, a substituted or unsubstituted pyrrolyl group, a substituted or unsubstituted pyrazolyl group, a substituted or unsubstituted imidazolyl group, a substituted or unsubstituted triazolyl group, a substituted or unsubstituted oxazolyl group, a substituted or unsubstituted isoxazolyl group, a substituted or unsubstituted thiazolyl group, a substituted or unsubstituted isothiazolyl group, a substituted or unsubstituted oxadiazolyl group, a substituted or unsubstituted thiadiazolyl group, a substituted or unsubstituted pyridyl group, a substituted or unsubstituted pyridinyl group, a substituted or unsubstituted pyrimidinyl group, a substituted or unsubstituted pyrazinyl group, a substituted or unsubstituted triazinyl group, a substituted or unsubstituted benzofuranyl group, a substituted or unsubstituted benzothiophenyl group, a substituted or unsubstituted benzimidazolyl group, a substituted or unsubstituted indolyl group, a substituted or unsubstituted quinolinyl group, a substituted or unsubstituted isoquinolinyl group, a substituted or unsubstituted quinazolinyl group, a substituted or unsubstituted phthalazinyl group, a substituted or unsubstituted quinoxalinyl group, a substituted or unsubstituted naphthyridinyl group, a substituted or unsubstituted cinnolinyl group, a substituted or unsubstituted benzoxazinyl group, a substituted or unsubstituted benzthiazinyl group, a substituted or unsubstituted acridinyl group, a substituted or unsubstituted phenazinyl group, a substituted or unsubstituted phenothiazinyl group, a substituted or unsubstituted phenoxazinyl group, a substituted or unsubstituted dibenzofuranyl group, a substituted or unsubstituted dibenzothiophenyl group, a substituted or unsubstituted benzotriazinyl group, a substituted or unsubstituted pyridopyrazinyl group, a substituted or unsubstituted pyridopyrimidinyl, a substituted or unsubstituted pyridopyridazinyl group, a substituted or unsubstituted benzothienyl group, or a substituted or unsubstituted benzoselenophenyl group.

13. The photoelectric device of claim 10, wherein, in Chemical Formula 1, the substituted or unsubstituted C5 to C30 aromatic hydrocarbon group is one of functional groups of Chemical Formula 1-1:

[Chemical Formula 1-1]

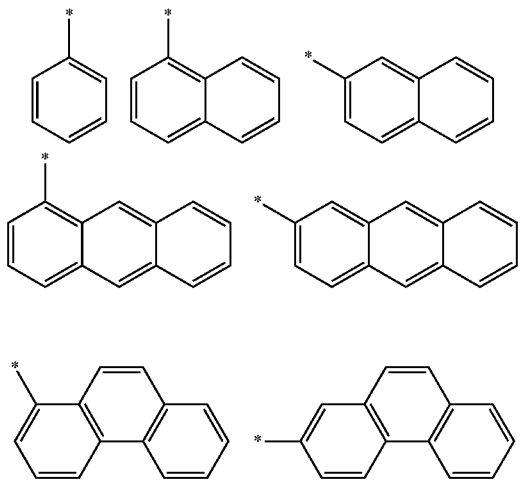

-continued

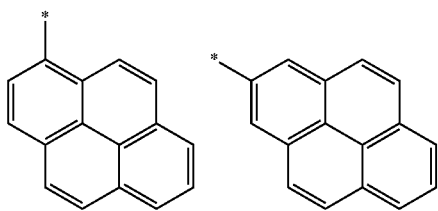

wherein, in Chemical Formula 1-1,
hydrogen of —CH— of each aromatic ring is optionally replaced by a substituent of a substituted or unsubstituted C1 to C20 alkyl group, a substituted or unsubstituted C1 to C20 alkoxy group, a substituted or unsubstituted C6 to C10 aryl group, a substituted or unsubstituted C4 to C10 heteroaryl group, a halogen, a cyano group, a cyano-containing group, or a combination thereof, and

* indicates a linking position.

14. The photoelectric device of claim 10, wherein, in Chemical Formula 1, the substituted or unsubstituted C3 to C30 hetero aromatic hydrocarbon group is one of functional groups represented by Chemical Formula 1-2:

[Chemical Formula 1-2]

(1)
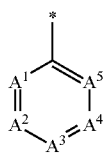

(2)
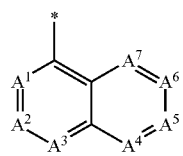

(3)
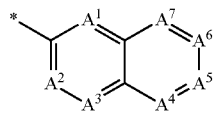

(4)
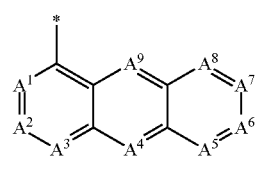

(5)
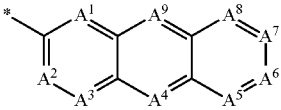

(6)
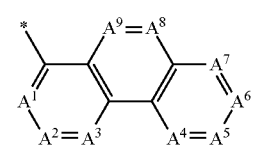

(7)
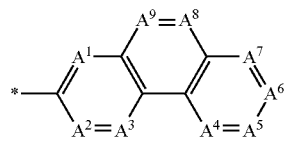

(8)
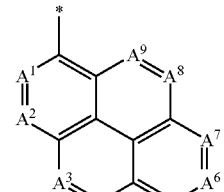

(9)
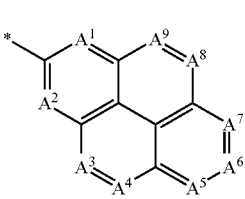

wherein, in Chemical Formula 1-2,
$A^1$ to $A^9$ are each independently N or $CR^k$, wherein, $R^k$ is hydrogen, deuterium, a substituted or unsubstituted C1 to C20 alkyl group, a substituted or unsubstituted C1 to C20 alkoxy group, a substituted or unsubstituted C6 to C10 aryl group, a substituted or unsubstituted C4 to C10 heteroaryl group, a cyano group, a cyano-containing group, or a combination thereof,
1 to 3 of $A^1$ to $A^5$ of Chemical Formula (1) of Chemical Formula 1-2 are N,
1 to 3 of $A^1$ to $A^7$ of Chemical Formulas (2) and (3) of Chemical Formula 1-2 are N,
1 to 4 of $A^1$ to $A^9$ of Chemical Formulas (4) to (9) of Chemical Formula 1-2 are N, and
* indicates a linking position.

15. The photoelectric device of claim 10, wherein in Chemical Formula 1, the substituted or unsubstituted C5 to C30 aromatic hydrocarbon group is one of functional groups represented by Chemical Formula 1-3:

[Chemical Formula 1-3]

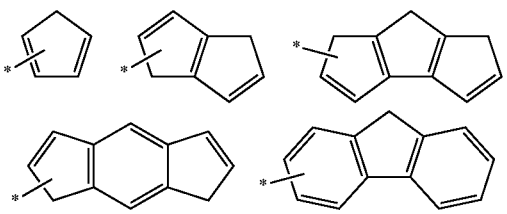

wherein, in Chemical Formula 1-3,
a hydrogen of —CH— of each aromatic ring is optionally replaced by a substituent of a substituted or unsubstituted C1 to C20 alkyl group, a substituted or unsubstituted C1 to C20 alkoxy group, a substituted or unsubstituted C6 to C10 aryl group, a substituted or unsubstituted C4 to C10 heteroaryl group, a halogen, a cyano group, a cyano-containing group, or a combination thereof, and
* indicates a linking position.

16. The photoelectric device of claim 10, wherein, in Chemical Formula 1, the substituted or unsubstituted C3 to C30 hetero aromatic hydrocarbon group is one of functional groups represented by Chemical Formula 1-4:

[Chemical Formula 1-4]

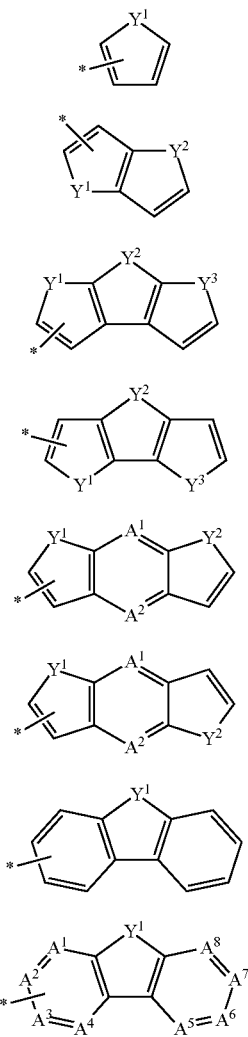

wherein, in Chemical Formula 1-4, $Y^1$ to $Y^3$ are each independently O, S, Se, Te, or $NR^a$, wherein, $R^a$ is hydrogen, deuterium, or a substituted or unsubstituted C1 to C10 alkyl group, $A^1$ to $A^8$ are each independently N or $CR^k$, wherein, $R^k$ is hydrogen, deuterium, a substituted or unsubstituted C1 to C20 alkyl group, a substituted or unsubstituted C1 to C20 alkoxy group, a substituted or unsubstituted C6 to C10 aryl group, a substituted or unsubstituted C4 to C10 heteroaryl group, a halogen, a cyano group, a cyano-containing group, or a combination thereof, a hydrogen of —CH— of each aromatic ring is optionally replaced by a substituent of a substituted or unsubstituted C1 to C20 alkyl group, a substituted or unsubstituted C1 to C20 alkoxy group, a substituted or unsubstituted C6 to C10 aryl group, a substituted or unsubstituted C4 to C10 heteroaryl group, a halogen, a cyano group, a cyano-containing group, or a combination thereof, in Chemical Formula (8) of Chemical Formula 1-4, one of $A^1$ to $A^4$ is a linking portion, and at least one of $A^1$ to $A^8$ is nitrogen (N), and \* indicates a linking position.

17. The photoelectric device of claim 10, wherein the active layer is configured to exhibit an absorption curve having a full width at half maximum (FWHM) of about 50 nm to about 90 nm.

18. The photoelectric device of claim 10, wherein the active layer is configured to exhibit an absorption curve having a central wavelength of less than or equal to about 460 nm.

19. An image sensor comprising the photoelectric device of claim 10.

20. The image sensor of claim 19, wherein
the image sensor includes
a semiconductor substrate integrated with a plurality of first photo-sensing devices configured to sense light in a green wavelength region and a plurality of second photo-sensing devices configured to sense light in a red wavelength region, and
the photoelectric device is on the semiconductor substrate and is configured to selectively sense light in a blue wavelength region.

21. The image sensor of claim 20, wherein the image sensor further includes a color filter layer including a green filter configured to selectively transmit light in the green wavelength region and a red filter configured to selectively transmit light in the red wavelength region.

22. The image sensor of claim 20, wherein the plurality of first photo-sensing devices and the plurality of second photo-sensing devices are stacked in a vertical direction in the semiconductor substrate.

23. The image sensor of claim 19, wherein
the photoelectric device is a blue photoelectric device configured to selectively sense light in a blue wavelength region,
the image sensor includes a red photoelectric device configured to selectively sense light in a red wavelength region, a green photoelectric device configured to selectively sense light in a green wavelength region, and the blue photoelectric device,
where the green photoelectric device, the blue photoelectric device, and the red photoelectric device are stacked.

24. An electronic device comprising the image sensor of claim 19.

* * * * *